United States Patent
Jung et al.

(10) Patent No.: US 10,616,518 B2
(45) Date of Patent: Apr. 7, 2020

(54) AMPLIFIER, AND ANALOG-TO-DIGITAL CONVERSION CIRCUIT AND IMAGE SENSOR INCLUDING THE SAME

(71) Applicant: SAMSUNG ELECTRONICS CO., LTD., Suwon-si, Gyeonggi-Do (KR)

(72) Inventors: Yun-Hwan Jung, Hwaseong-si (KR); Sun-Yool Kang, Iksan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 110 days.

(21) Appl. No.: 16/008,186

(22) Filed: Jun. 14, 2018

(65) Prior Publication Data

US 2019/0116331 A1  Apr. 18, 2019

(30) Foreign Application Priority Data

Oct. 16, 2017 (KR) .................. 10-2017-0134251

(51) Int. Cl.
| | |
|---|---|
| *H04N 5/374* | (2011.01) |
| *H04N 5/3745* | (2011.01) |
| *H03F 1/02* | (2006.01) |
| *H03F 3/45* | (2006.01) |
| *H03M 1/56* | (2006.01) |
| *H04N 5/357* | (2011.01) |

(52) U.S. Cl.
CPC ......... *H04N 5/3745* (2013.01); *H03F 1/0211* (2013.01); *H03F 3/4521* (2013.01); *H03F 3/45475* (2013.01); *H03M 1/56* (2013.01); *H04N 5/3575* (2013.01); *H04N 5/37455* (2013.01); *H03F 2200/129* (2013.01); *H03F 2200/156* (2013.01); *H03F 2200/297* (2013.01); *H03F 2203/45116* (2013.01); *H03F 2203/45156* (2013.01); *H03F 2203/45536* (2013.01); *H03F 2203/45544* (2013.01)

(58) Field of Classification Search
CPC .... H03F 1/0211; H03F 3/45475; H03M 1/56; H04N 5/3745; H04N 5/37455; H04N 5/374; H04N 5/378
USPC .......................................... 250/214 R, 208.1
See application file for complete search history.

(56) References Cited

U.S. PATENT DOCUMENTS

| | | |
|---|---|---|
| 7,482,871 B2 | 1/2009 | Lee et al. |
| 7,583,147 B2 | 9/2009 | Ruck |

(Continued)

FOREIGN PATENT DOCUMENTS

| | | |
|---|---|---|
| JP | WO2016009832 | 4/2017 |
| KR | 10-0819119 | 3/2008 |

(Continued)

*Primary Examiner* — Que Tan Le
(74) *Attorney, Agent, or Firm* — F. Chau & Associates, LLC

(57) ABSTRACT

An analog-to-digital conversion circuit includes a first amplifier that generates a first output signal by comparing a pixel signal output from a pixel array with a ramp signal, and a second amplifier that generates a comparison signal based on the first output signal. The first amplifier includes a first current source that generates a first bias current in a first operation period and a second operation period, and a second current source that generates a second bias current in the first operation period. The analog-to-digital conversion circuit converts an analog signal output from the pixel array into a digital signal.

20 Claims, 21 Drawing Sheets

(56) References Cited

U.S. PATENT DOCUMENTS

| | | |
|---|---|---|
| 8,269,872 B2 | 9/2012 | Okumura |
| 8,625,014 B2 | 1/2014 | Yoo et al. |
| 8,773,191 B2 | 7/2014 | Park et al. |
| 9,055,250 B2 | 6/2015 | Park et al. |
| 9,086,400 B2 | 7/2015 | Minch et al. |
| 9,143,119 B2 * | 9/2015 | Sohn .................... H03K 5/1252 |
| 9,143,714 B2 | 9/2015 | Nishikido et al. |
| 9,282,264 B2 | 3/2016 | Park et al. |
| 9,559,699 B1 | 1/2017 | Zhang et al. |
| 2014/0312207 A1 | 10/2014 | Ikeda et al. |
| 2016/0307325 A1 | 10/2016 | Wang et al. |
| 2017/0054926 A1 | 2/2017 | Kikuchi et al. |
| 2017/0366771 A1 | 12/2017 | Jung et al. |

FOREIGN PATENT DOCUMENTS

| | | |
|---|---|---|
| KR | 10-2011-0124512 | 11/2011 |
| KR | 10-2014-0033604 | 3/2014 |
| KR | 10-2016-0124664 | 10/2016 |
| KR | 10-2017-0141852 | 12/2017 |

\* cited by examiner

<Auto-Zero>

<Ramp Offset>

<Ramp Down>

<L-H Decision>

<After Decision>

<H-L Operation> logic decision
(L-H decision)

AMPLIFIER, AND ANALOG-TO-DIGITAL CONVERSION CIRCUIT AND IMAGE SENSOR INCLUDING THE SAME

CROSS-REFERENCE TO RELATED APPLICATIONS

This application claims priority under 35 U.S.C. § 119 to Korean Patent Application No. 10-2017-0134251, filed on Oct. 16, 2017, the disclosure of which is incorporated by reference herein in its entirety.

TECHNICAL FIELD

The inventive concept relates to an image sensor, and more particularly, to an amplifier for image sensors, and an analog-to-digital conversion circuit and an image sensor including the same.

DISCUSSION OF THE RELATED ART

Image sensors are devices that capture a two-dimensional (2D) or three-dimensional (3D) image of an object. Image sensors generate an image of an object by using a photoelectric conversion device responding in accordance with intensity of light reflected by an object. Recently, as complementary metal-oxide semiconductor (CMOS) technology has developed, CMOS image sensors using CMOSs have become widely used. In CMOS image sensors, to remove reset noise of pixels, a correlated double sampling (CDS) technique may be used. To improve image quality, there is a demand for high performance of an analog-to-digital conversion circuit using a CDS technique.

SUMMARY

Exemplary embodiments of the inventive concept provide an amplifier capable of improving the quality of an image signal by reducing noise and increasing an input range, and an analog-to-digital conversion circuit and an image sensor which include the amplifier.

According to an exemplary embodiment of the inventive concept, an analog-to-digital conversion circuit includes a first amplifier that generates a first output signal by comparing a pixel signal output from a pixel array with a ramp signal, and a second amplifier that generates a comparison signal based on the first output signal. The first amplifier includes a first current source that generates a first bias current in a first operation period and a second operation period, and a second current source that generates a second bias current in the first operation period. The analog-to-digital conversion circuit converts an analog signal output from the pixel array into a digital signal.

According to an exemplary embodiment of the inventive concept, an amplifier includes a first current source that generates a first bias current based on a first power supply voltage in a first operation period and a second operation period, and a second current source that generates a second bias current based on a second power supply voltage in the first operation period. The second current source is turned off in the second operation period. The amplifier further includes an input stage that receives a pixel signal and a ramp signal, and an output stage that outputs a comparison signal generated based on a level difference between the pixel signal and the ramp signal.

According to an exemplary embodiment of the inventive concept, an image sensor includes a pixel array including a plurality of pixels, and a comparison circuit that compares a pixel signal output from the pixel array with a ramp signal. The comparison circuit operates in an auto-zero period based on a first bias current, and operates in a comparison operation period based on a second bias current that is different from the first bias current.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
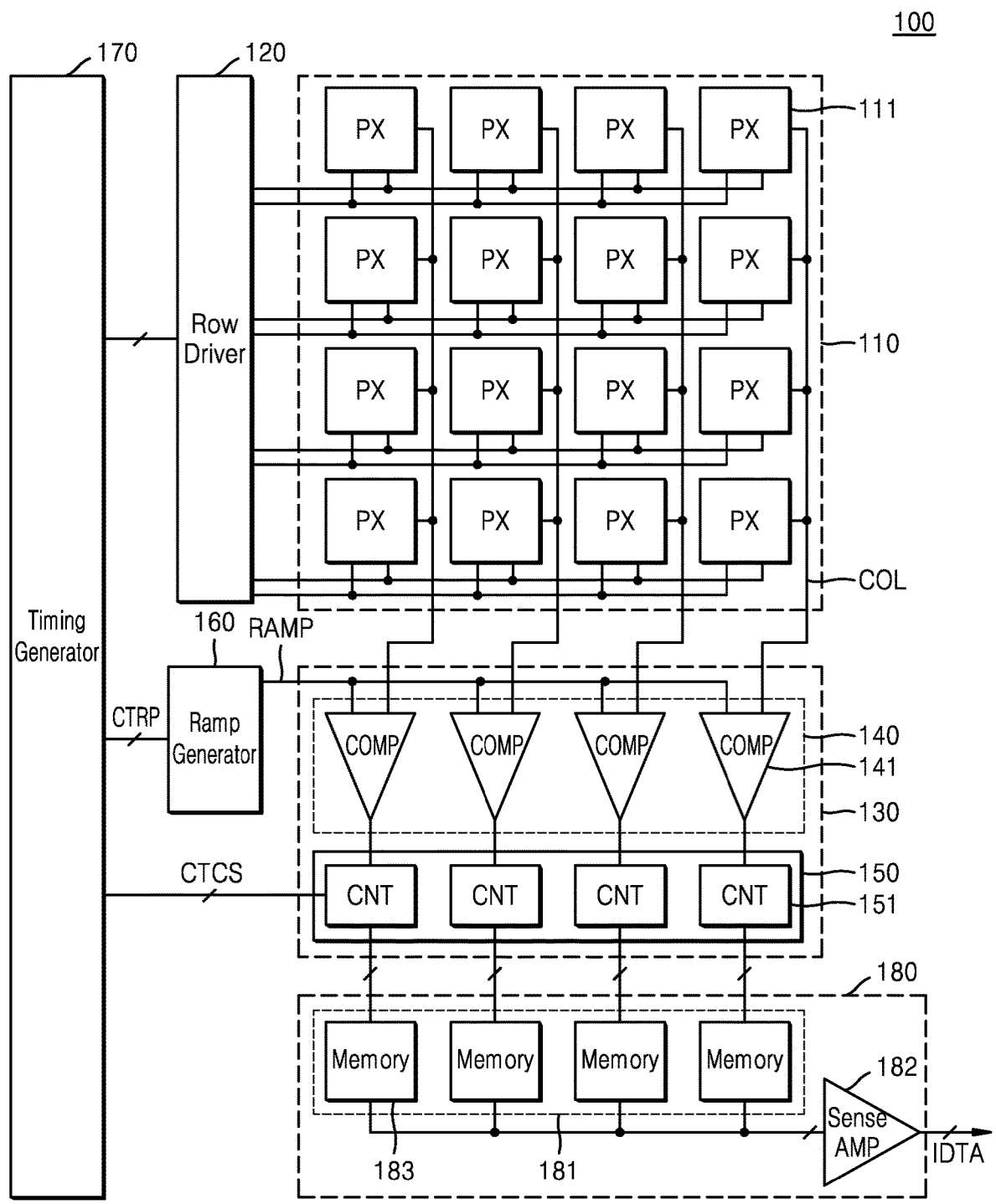
FIG. 1 is a block diagram illustrating an image sensor according to an exemplary embodiment of the inventive concept.

Hereinafter, exemplary embodiments of the inventive concept will be described in detail with reference to the accompanying drawings. Like reference numerals may refer to like elements throughout the accompanying drawings.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Herein, when one value is described as being about equal to another value, e.g. "a first current is about equal to a second current", it is to be understood that the values are equal to each other to within a measurement error, or if measurably unequal, are close enough in value to be functionally equal to each other as would be understood by a person having ordinary skill in the art.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a block diagram illustrating an image sensor according to an exemplary embodiment of the inventive concept.

An image sensor 100 may be mounted in electronic devices having an image or light sensing function. The image sensor 100 may be mounted in electronic devices such as, for example, cameras, smartphones, wearable devices, Internet of Things (IoT) devices, tablet personal computers (PCs), personal digital assistants (PDAs), portable multimedia players (PMPs), navigation systems, etc. In addition, the image sensor 100 may be mounted in electronic devices that are included as components in vehicles, furniture, manufacturing facilities, doors, various measuring instruments, etc.

In an exemplary embodiment, the image sensor 100 includes a pixel array 110, a row driver 120, an analog-to-digital converter (ADC) 130, a ramp generator 160, a timing generator 170, and a buffer 180.

The pixel array 110 includes a plurality of pixels 111 connected to a plurality of row lines and a plurality of column lines COL, and arranged in a matrix form. Each of the plurality of pixels 111 includes a light sensing device. For example, the light sensing device may include a photodiode, a phototransistor, a photogate, a pinned photodiode, etc. In exemplary embodiments, each of the plurality of pixels 111 includes at least one light sensing device. In exemplary embodiments, each of the plurality of pixels 111 includes a plurality of light sensing devices. The plurality of light sensing devices may be stacked on each other.

Each of the plurality of pixels 111 may sense light by using a light sensing device, and convert the light into a pixel signal that is an electrical signal. Each of the plurality of pixels 111 may sense light in a specific spectrum range. For example, the plurality of pixels 111 may include a red pixel that converts light in a red spectrum range into an electrical signal, a green pixel that converts light in a green spectrum range into an electrical signal, and a blue pixel that converts light in a blue spectrum range into an electrical signal. A color filter may be arranged over each of the plurality of pixels 111. The color filter transmits light in a specific spectrum range. For example, a red color filter transmits light in a red spectrum range, a green color filter transmits light in a green spectrum range, and a blue color filter transmits light in a blue spectrum range.

The timing generator 170 may output a control signal or a clock signal to each of the row driver 120, the ADC 130, and the ramp generator 160, and thus control an operation or timing of each of the row driver 120, the ADC 130, and the ramp generator 160.

The row driver 120 drives the pixel array 110 on a row-by-row basis. The row driver 120 may decode a row control signal (for example, an address signal) generated by the timing generator 170, and may select at least one of row lines, which constitute the pixel array 110, in response to the decoded row control signal. For example, the row driver 120 may generate a row select signal. In addition, the pixel array 110 outputs a pixel signal from a row selected by the row select signal that is provided by the row driver 120. The pixel signal may include a reset signal and an image signal.

The ADC 130 converts an analog pixel signal, which is input from the pixel array 110, into a digital signal. In an exemplary embodiment, the ADC 130 includes a comparison block 140 (also referred to herein as a comparison circuit or a comparator) and a counter block 150 (also referred to herein as a counter circuit or a counter).

The comparison block 140 compares a pixel signal with a ramp signal RAMP, the pixel signal being output from a unit pixel connected to one of the column lines COL that constitute the pixel array 110. The comparison block 140 includes a plurality of comparison circuits 141 provided in correspondence with the respective column lines COL. Each of the comparison circuits 141 is connected to the pixel array 110 and the ramp generator 160.

A comparison circuit 141 compares the pixel signal input thereto with the ramp signal RAMP generated by the ramp generator 160 input thereto, and outputs a comparison result signal to an output stage.

The comparison circuit 141 may generate the comparison result signal to which a correlated double sampling technique is applied. The comparison circuit 141 may also be referred to herein as a correlated double sampling circuit. Pixel signals output from the plurality of pixels 111 may have a deviation caused by characteristics (for example, fixed pattern noise (FPN)) intrinsic to each pixel and/or a deviation caused by a difference in characteristics of logic for outputting a pixel signal from a pixel 111. To compensate the deviation between the pixel signals, a reset component (or reset signal) and an image component (or image signal) are calculated for each of the pixel signals, and a difference therebetween is extracted as an effective signal component. This technique is referred to as correlated double sampling.

The comparison circuit 141 may output the comparison result signal to which the correlated double sampling technique is applied.

The comparison circuit 141 may include a first amplifier that compares the pixel signal with the ramp signal, and a second amplifier that amplifies and outputs an output of the first amplifier. In an exemplary embodiment, the first amplifier may be operated, in an auto-zero phase, based on a smaller amount of a bias current than in a comparison operation phase. Thus, noise may be reduced, and an input range may be increased. In an exemplary embodiment, the second amplifier may adaptively control, on an operation phase basis, current sources generating bias currents, and may generate a minimum bias current before and after a decision. Therefore, a power fluctuation due to an operation of the second amplifier may be prevented. In an exemplary embodiment, the first amplifier may include a limiting circuit connecting an output terminal to a common node. The limiting circuit may prevent a voltage level of the common node from being reduced below a minimum value which allows the first amplifier to be normally operated, and may compensate a voltage fluctuation occurring at an output node.

The ramp generator 160 generates the ramp signal. The ramp generator 160 may be operated based on a ramp control signal CTRP provided by the timing generator 170. The ramp control signal CTRP may include a ramp enable signal, a mode signal, etc. When the ramp enable signal is activated, the ramp generator 160 may generate the ramp signal having a slope that is set based on the mode signal.

The counter block 150 includes a plurality of counters 151 (also referred to as counter circuits). Each of the plurality of counters 151 may be connected to an output stage of each comparison circuit 141 and may count based on an output of each comparison circuit 141. A counter control signal CTCS may include, for example, a counter clock signal, a counter reset signal that controls a reset operation of the plurality of counters 151, an inversion signal that inverts an inner bit of each of the plurality of counters 151, etc. The counter block 150 counts the comparison result signal according to the counter clock signal and outputs this result as a digital signal.

A counter 151 may include, for example, an up/down counter (also referred to herein as an up/down counter circuit), a bitwise inversion counter (also referred to herein as a bitwise inversion counter circuit), etc. Here, the bitwise inversion counter may perform a similar operation to the up/down counter. For example, the bitwise inversion counter may perform a function of only up-counting and a function of setting all bits inside the counter to 1's complement by inverting the bits when a specific signal is input. The bitwise inversion counter may perform reset-counting, and then convert this result into 1's complement (e.g., a negative value), by inversion thereof.

The buffer 180 temporarily stores a digital signal output from the ADC 130. The buffer 180 then senses, amplifies and outputs the digital signal. The buffer 180 may include, for example, a column memory block 181 and a sense amplifier 182. The column memory block 181 may include a plurality of memories 183. Each of the plurality of memories 183 may temporarily store a digital signal output from each of the plurality of counters 151, and then may output the digital signal to the sense amplifier 182. The sense amplifier 182 may sense and amplify digital signals output from the plurality of memories 183. The sense amplifier 182 may output the amplified digital signals as image data IDTA.

Figure 2:
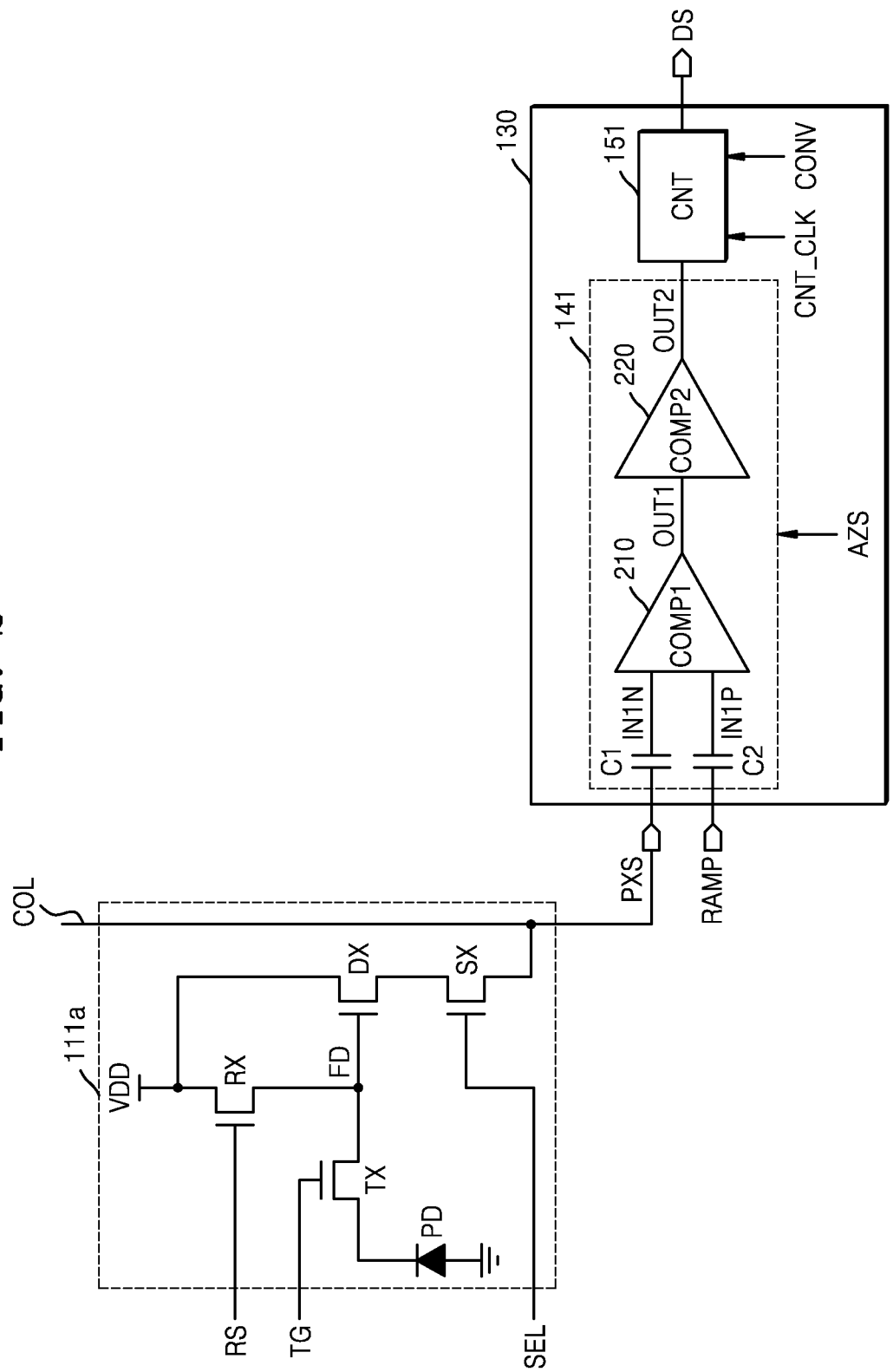
FIG. 2 is a block diagram illustrating an analog-to-digital converter (ADC) according to an exemplary embodiment of the inventive concept.
Figure 3:
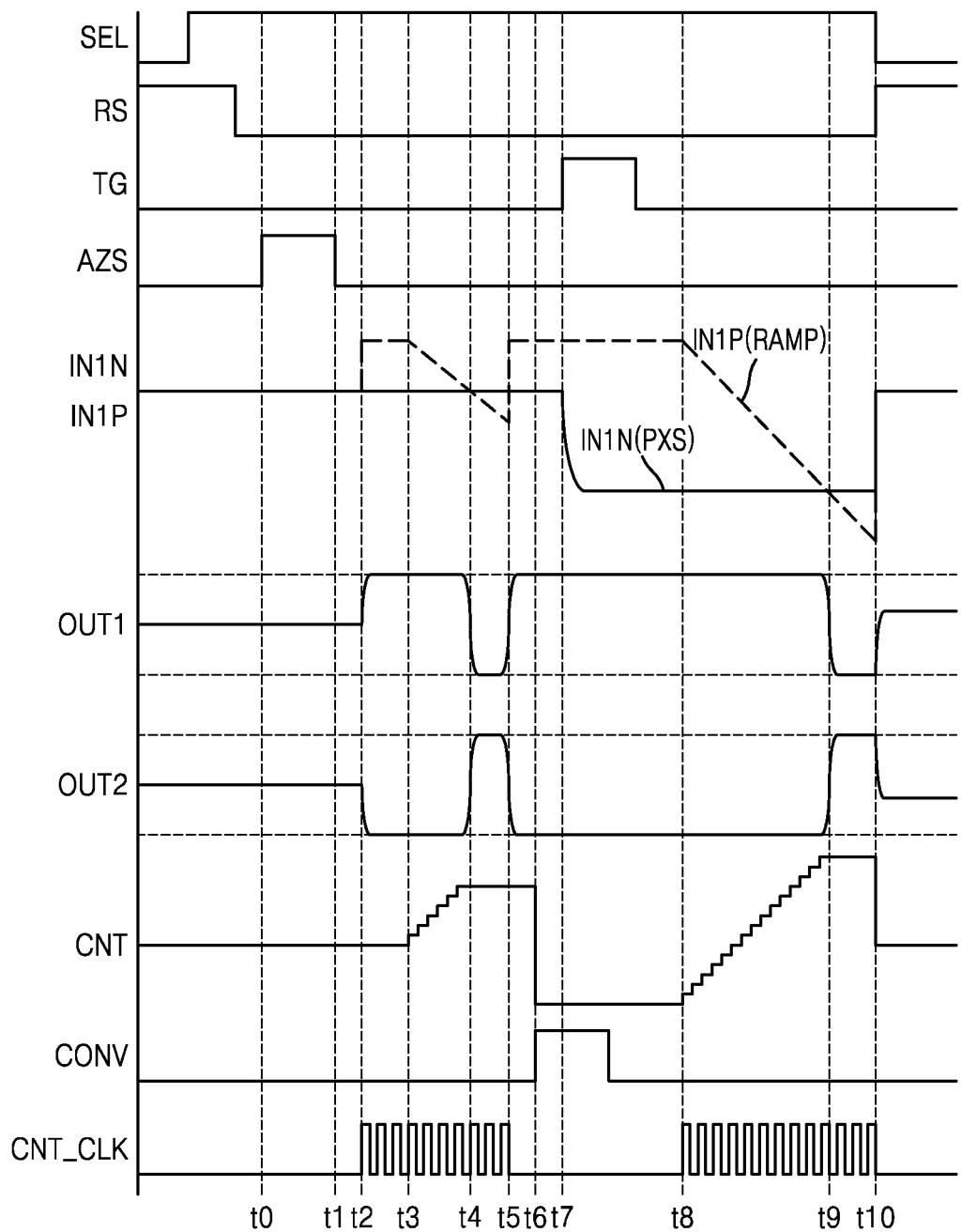
FIG. 3 is a timing diagram of the ADC of FIG. 2.

FIG. 2 is a block diagram illustrating an ADC according to an exemplary embodiment of the inventive concept. FIG. 3 is a timing diagram of the ADC of FIG. 2. For convenience of explanation, the ADC will be described together with a pixel 111a according to an exemplary embodiment of the inventive concept.

Referring to FIGS. 2 and 3, in an exemplary embodiment, the pixel 111a includes a photodiode PD, a transfer transistor TX, a floating diffusion node FD, a reset transistor RX, a drive transistor DX, and a selection transistor SX. According to exemplary embodiments, another photoelectric conversion device may be substituted for the photodiode PD.

The photodiode PD generates a photo-charge varying with intensity of incident light. The transfer transistor TX may transfer the photo-charge to the floating diffusion node FD according to a transfer control signal TG output from the row driver (see 120 of FIG. 1). The drive transistor DX may amplify and transfer the photo-charge to the selection transistor SX according to an electric potential due to the photo-charge accumulated at the floating diffusion node FD. A drain of the selection transistor SX may be connected to a source of the drive transistor DX. The selection transistor SX may output a pixel signal PXS to a column line COL connected to the pixel 111a according to a selection signal SEL output from the row driver 120. The reset transistor RX may reset the floating diffusion node FD to a level of a power supply voltage VDD according to a reset control signal RS provided by the row driver 120.

In exemplary embodiments, the ADC 130 includes the comparison circuit 141 and the counter 151. Although one comparison circuit 141 and one counter 151 connected to one column line COL are shown in FIG. 2 for convenience of illustration, it is to be understood that exemplary embodiments of the inventive concept are not limited thereto. For example, according to exemplary embodiments, the ADC 130 may include the plurality of comparison circuits 141 and the plurality of counters 151 connected to the plurality of column lines COL, as described above with reference to FIG. 1.

The comparison circuit 141 may include a first comparator 210, a second comparator 220, and capacitors C1 and C2. The first comparator 210 may compare the pixel signal PXS and the ramp signal RAMP, which are respectively received through the capacitors C1 and C2, with each other, and may output a comparison result. The first comparator 210 may include, for example, a differential amplifier, the ramp signal RAMP may be received into a first input IN1P of the first comparator 210, and the pixel signal PXS may be received into a second input IN1N of the first comparator 210.

The second comparator 220 may amplify or invert an output (e.g., OUT1) of the first comparator 210. The second comparator 220 may include, for example, a differential amplifier, an inverter, etc. An output (e.g., OUT2) of the second comparator 220 is provided as a comparison result signal to the counter 151. Herein, the output OUT2 may also be referred to as a comparison signal. The comparison circuit 141 may be initialized in response to an auto-zero signal AZS in an auto-zero period before a comparison operation is performed.

The counter 151 may count the comparison result signal (e.g., the second output OUT2) based on a counting clock signal CNT_CLK and an inversion signal CONV, and thus, may output a digital signal DS. The digital signal DS may have a digital value corresponding to an image component obtained by removing a reset component from the pixel signal PXS. For example, the digital signal DS may have a digital value corresponding to to an image signal.

Referring to FIG. 3, in an exemplary embodiment, a period from a time point t0 to a time point t1 is defined as an auto-zero period, and a period from a time point t1 to a time point t10 is defined as a comparison operation period. In the period from the time point t0 to the time point t1, the auto-zero signal AZS is activated, and the comparison circuit 141 is initialized in response to the auto-zero signal AZS. For example, levels of input nodes and/or output nodes of the first comparator 210 and the second comparator 220 may become equal. For digital conversion of a reset signal, an offset may be applied to the ramp signal RAMP at a time point t2, and then, the ramp signal RAMP may decrease starting from a time point t3. The counter 151 may count the counting clock signal CNT_CLK from the time point t3 until a time point t4 at which a polarity of the output of the second comparator 220 (e.g., the second output OUT2) is changed.

When the digital conversion of the reset signal is finished, to convert the image signal into a digital signal, an offset may be applied again to the ramp signal RAMP at a time point t5, and then, a bit of the counter 151 may be inverted in response to the inversion signal CONV at a time point t6. At a time point t7, the transfer control signal TG may be turned on, and the second input IN1N of the first comparator 210 may be changed as shown in FIG. 3 due to a charge accumulated by a photosensor, that is, the photodiode PD, until the time point t7.

For digital conversion of the image signal, the ramp signal RAMP may decrease at a time point t8. The counter 151 may count the counting clock signal CNT_CLK from the time point t8 until a time point t9 at which the polarity of the output of the second comparator 220 (e.g., the second output OUT2) is changed. Although FIG. 3 illustrates that the image signal is converted into the digital signal by bit-conversion and up-counting performed by the counter 151, it is to be understood that exemplary embodiments of the inventive concept are not limited thereto, and that the counter 151 may be implemented in various manners. When the digital conversion of the image signal is finished, the ADC 130 may be initialized for correlated double sampling for the next pixel 111a. Operation timings of the ADC 130 have been described with reference to FIG. 3. However, it is to be understood that this description is exemplary, and that timings of the signals may vary depending upon an implementation method of the ADC 130, for example, structures of the first comparator 210 and the second comparator 220, etc.

Figure 4:
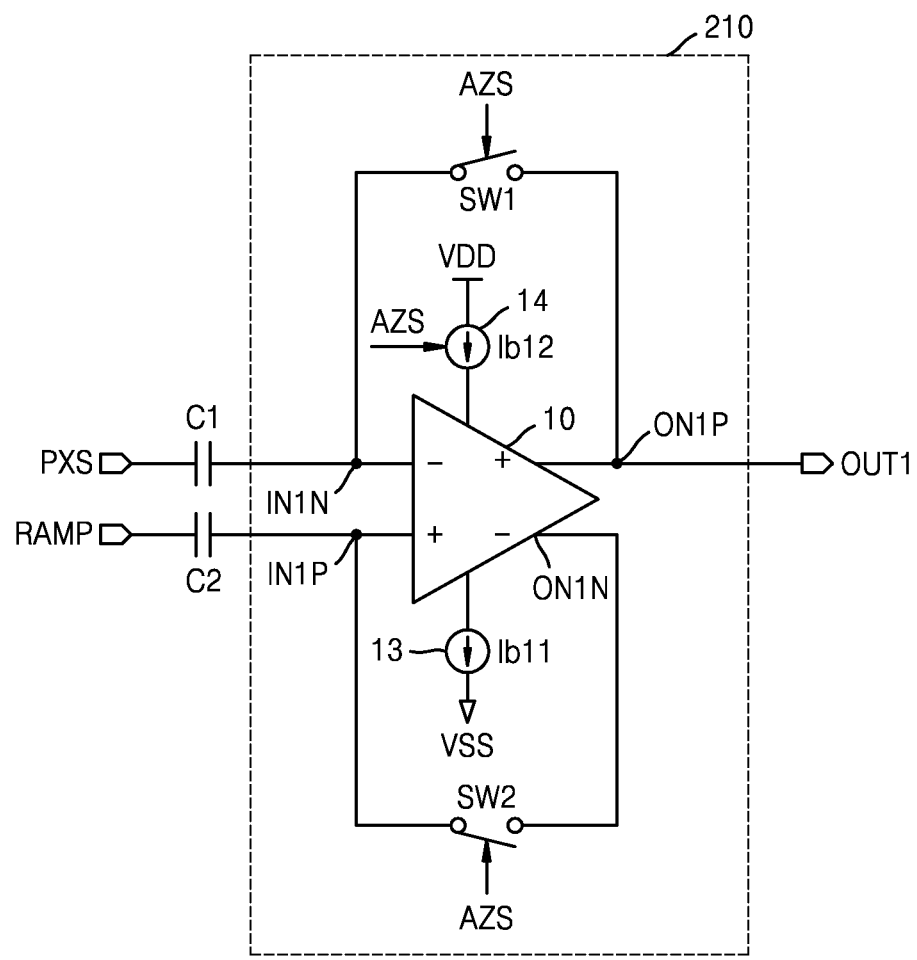
FIG. 4 is a circuit diagram illustrating a first comparator according to an exemplary embodiment of the inventive concept.

FIG. 4 is a circuit diagram illustrating a first comparator according to an exemplary embodiment of the inventive concept.

Referring to FIG. 4, in an exemplary embodiment, the first comparator 210 includes a first amplifier 10 and switches SW1 and SW2. The switches SW1 and SW2 connect an input and an output of the first amplifier 10 to each other in response to the auto-zero signal AZS. For example, a first switch SW1 may be turned on and connect the second input IN1N of the first amplifier 10 to a first output node ON1P thereof, and a second switch SW2 may be turned on and connect the first input IN1P of the first amplifier 10 to a second output node ON1N thereof. As the switches SW1 and SW2 are turned on in the auto-zero period (for example, the period from the time point t0 to the time point t1 in FIG. 3), the offset of the first amplifier 10 may be canceled.

The first amplifier 10, which is a differential amplifier, may be implemented with an operational transconductance amplifier (OTA), an operational amplifier, etc. In an exemplary embodiment, the first amplifier 10 includes a first current source 13 and a second current source 14. The first current source 13 and the second current source 14 may be respectively referred to herein as a first bias circuit and a second bias circuit.

In an exemplary embodiment, the first current source 13 generates a bias current Ib11 for a comparison operation of the first amplifier 10. The second current source 14 generates a second bias current Ib12 before the comparison operation period, for example, in the auto-zero period. The second current source 14 generates the second bias current Ib12 in response to the activated auto-zero signal AZS (or a synchronous signal of the auto-zero signal). In an exemplary embodiment, the second bias current Ib12 is less than the first bias current Ib11.

In the auto-zero period, the first current source 13 and the second current source 14 may be operated in a complementary manner. For example, in an exemplary embodiment, the first current source 13 may be connected to a first power supply voltage, for example, to a ground voltage VSS, and may sink the first bias current Ib11, and the second current source 14 may be connected to a second power supply voltage higher than the first power supply voltage, for example, to a power supply voltage VDD, and may source the second bias current Ib12. Thus, in the auto-zero period, the first amplifier 10 may be operated based on a current less than the first bias current Ib11, that is, a current obtained by subtracting the second bias current Ib12 from the first bias current Ib11. Next, in the comparison operation period (for example, the period from the time point t1 to the time point t10), since the second current source 14 is turned off, the first amplifier 10 may be operated based on the first bias current Ib11.

In an exemplary embodiment, unlike the exemplary embodiment shown in FIG. 4, the first current source 13 may be connected to the second power supply voltage, for example, to the power supply voltage VDD, and may source the first bias current Ib11, and the second current source 14 may be connected to first power supply voltage, for example, to the ground voltage VSS, and may sink the second bias current Ib12.

Figure 5:
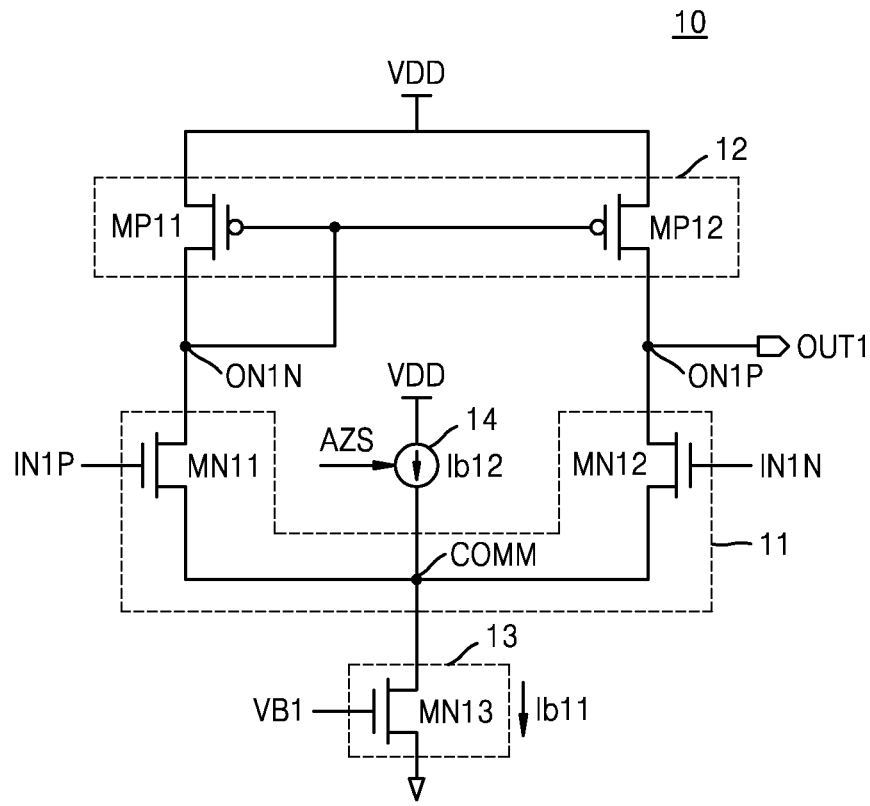
FIG. 5 is a circuit diagram illustrating a first amplifier according to an exemplary embodiment of the inventive concept.
Figure 6:
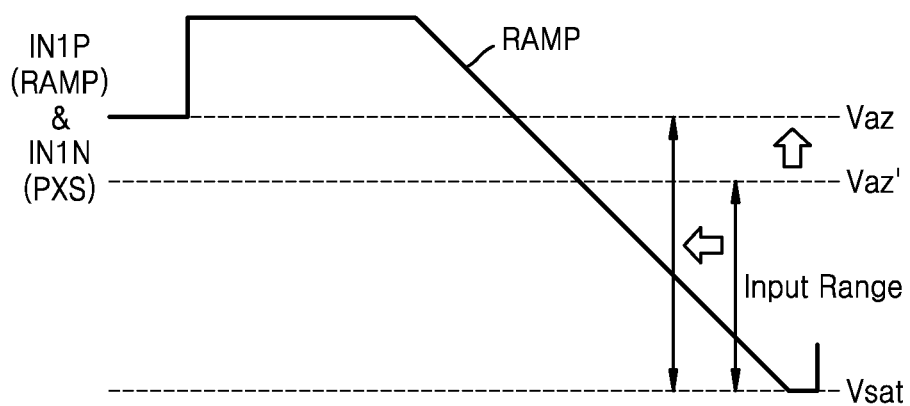
FIG. 6 is a diagram illustrating an input range of a first amplifier.

FIG. 5 is a circuit diagram illustrating a first amplifier according to an exemplary embodiment of the inventive concept. FIG. 6 is a diagram illustrating an input range of the first amplifier.

Referring to FIG. 5, in an exemplary embodiment, the first amplifier 10 includes an input stage 11, an output stage 12, the first current source 13, and the second current source 14.

The input stage 11 and the output stage 12 refer to circuit components such as, for example, transistors, grouped together within the respective stages, as described below. Thus, the input stage 11 and the output stage 12 may also be respectively referred to herein as an input stage circuit portion and an output stage circuit portion.

As described above with reference to FIG. 4, the first current source 13 may generate the first bias current Ib11, and the second current source 14 may generate second bias current Ib12, before the comparison operation period (e.g., in the auto-zero period).

In an exemplary embodiment, the first current source 13 includes a transistor MN13. The transistor MN13 may be, for example, an NMOS transistor. For example, the transistor MN13 may be an N-type metal oxide semiconductor field effect transistor (MOSFET). The transistor MN13 may be connected to the ground voltage VSS, and may generate the first bias current Ib11 based on a first bias voltage VB1.

The second current source 14 will be described in detail with reference to FIGS. 7A and 7B.

The input stage 11 receives differential inputs, for example, the first input IN1P and the second input IN1N, and generates a differential current due to a level difference between the first input IN1P and the second input IN1N. For example, the ramp signal (see RAMP of FIG. 4) may be provided as the first input IN1P, and the pixel signal PXS may be received as the second input IN1N. In an exemplary embodiment, the input stage 11 includes a transistor MN11 and a transistor MN12. According to exemplary embodiments, an equal current flows through the transistor MN11 and the transistor MN12 when the first input IN1P and the second input IN1N are identical to each other, and different currents respectively flow through the transistor MN11 and the transistor MN12 when the first input IN1P and the second input IN1N are different from each other. Each of the transistor MN11 and the transistor MN12 may be, for example, an NMOS transistor.

According to exemplary embodiments, a sum of amounts of currents flowing through the transistor MN11 and the transistor MN12 is about equal to an amount of the bias current. For example, in the auto-zero period, the sum of the amounts of the currents flowing through the transistor MN11 and the transistor MN12 is an amount of the current obtained by subtracting the second bias current Ib12 from the first bias current Ib11. After the auto-zero period (e.g., in the comparison operation period), the sum of the amounts of the currents flowing through the NMOS transistor MN11 and the NMOS transistor MN12 is about equal to an amount of the first bias current Ib11.

In an exemplary embodiment, the output stage 12 includes a transistor MP11 and a transistor MP12, and voltage levels of the output nodes ON1N and ON1P may be determined by current mirroring of the transistor MP11 and the transistor MP12. Each of the transistor MP11 and the transistor MP12 may be, for example, a PMOS transistor. For example, each of the transistor MP11 and the transistor M12 may be a P-type MOSFET. A voltage level of each of the output nodes ON1N and ON1P may be determined based on an amount of a current flowing through each of the transistor MN11 and the transistor MN12. If a level of the first input IN1P is higher than a level of the second input IN1N, a relatively large amount of a current flows through the transistor MN11. Thus, a level of a first output node ON1P is reduced, and a level of a second output node ON1N is increased. The output stage 12 may output a current generated based on the level difference between the first input IN1P and the second input IN1N.

As described above with reference to FIG. 4, the switches SW1 and SW2 are turned on in the auto-zero period, whereby the second input IN1N may be connected to the first output node ON1P, and the first input IN1P may be connected to the second output node ON1N. Thus, the first input IN1P, the second input IN1N, the first output node ON1P, and the second output node ON1N may be at about an equal level. The level of each of the first input IN1P, the second input IN1N, the first output node ON1P, and the second output node ON1N set in the auto-zero period may be referred to herein as an auto-zero voltage.

Referring to FIG. 6, an input range of the first amplifier 10 may be determined by levels of an auto-zero voltage Vaz and a saturation voltage Vsat. Here, the saturation voltage Vsat is a voltage of a common node COMM, and is determined by characteristics of the transistor MN13 connected to the common node COMM. A minimum level of the first input IN1P receiving the ramp signal RAMP may be the level of the saturation voltage Vsat.

To improve noise, a bias current (e.g., the first bias current Ib11) for an operation of the first amplifier 10 may be increased. However, when the first bias current Ib11 is increased, since a current flowing through the input stage 11 and the output stage 12 in the auto-zero period is increased, the auto-zero voltage Vaz may be reduced.

However, in the first amplifier 10 according to an exemplary embodiment of the inventive concept, in the auto-zero period, the first current source 13 and the second current source 14 may be operated in a complementary manner as described above. As a result, a current less than the first bias current Ib11 may flow through the input stage 11 and the output stage 12. Next, in the comparison operation period, the first bias current Ib11 generated by the first current source 13 may flow through the input stage 11 and the output stage 12. Therefore, even though the bias current (e.g., the first bias current Ib11) for the comparison operation of the first amplifier 10 is increased, the auto-zero voltage Vaz may be set high. For example, as an amount of the second bias current Ib12 is set higher, the auto-zero voltage Vaz may become higher. However, since the auto-zero voltage Vaz may vary based on other physical characteristics of the first amplifier 10, the second bias current Ib12 and the auto-zero voltage Vaz are not limited to a proportional relationship.

Referring still to FIG. 6, due to the aforementioned operation of the first amplifier 10 according to an exemplary embodiment of the inventive concept, the auto-zero voltage Vaz in a case in which the bias current in the auto-zero period is less than the bias current in the operation period is higher than an auto-zero voltage Vaz' in a case in which the bias current in the auto-zero period is about equal to the bias current in the operation period. Therefore, the first amplifier 10 according to an exemplary embodiment of the inventive concept may increase the input range even while reducing noise.

Figure 7A:
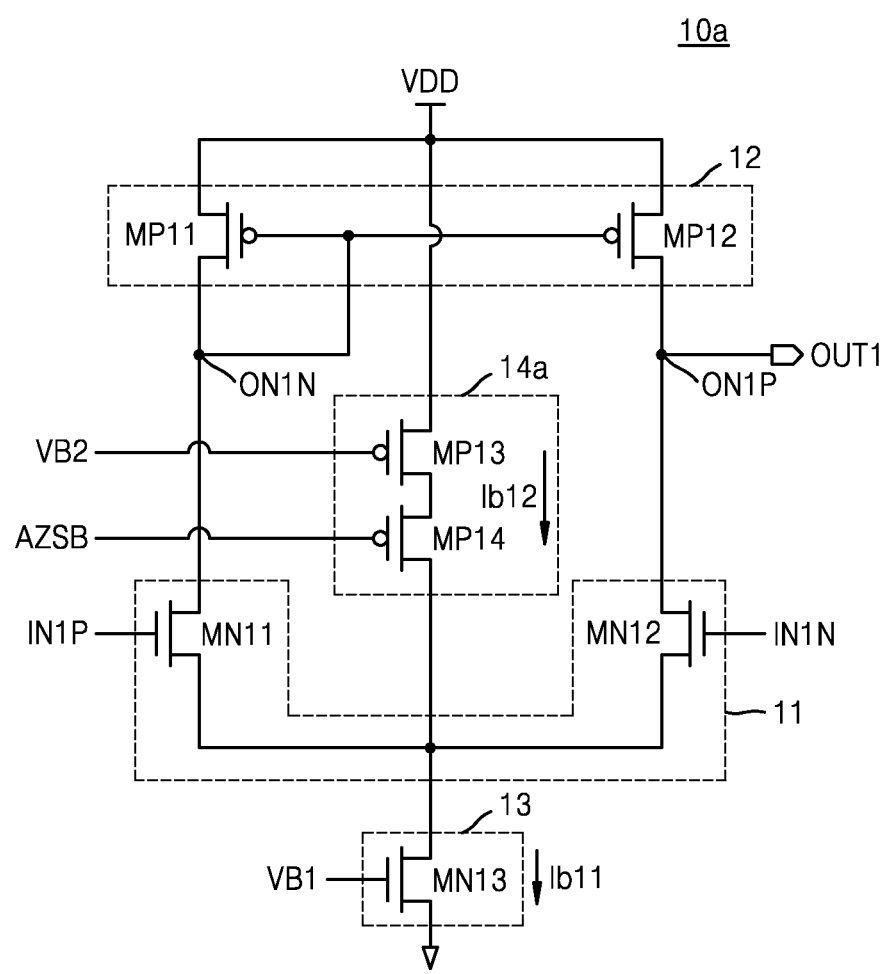
FIGS. 7A and 7B are circuit diagrams illustrating implementation examples of a first amplifier according to an exemplary embodiment of the inventive concept.
Figure 7B:
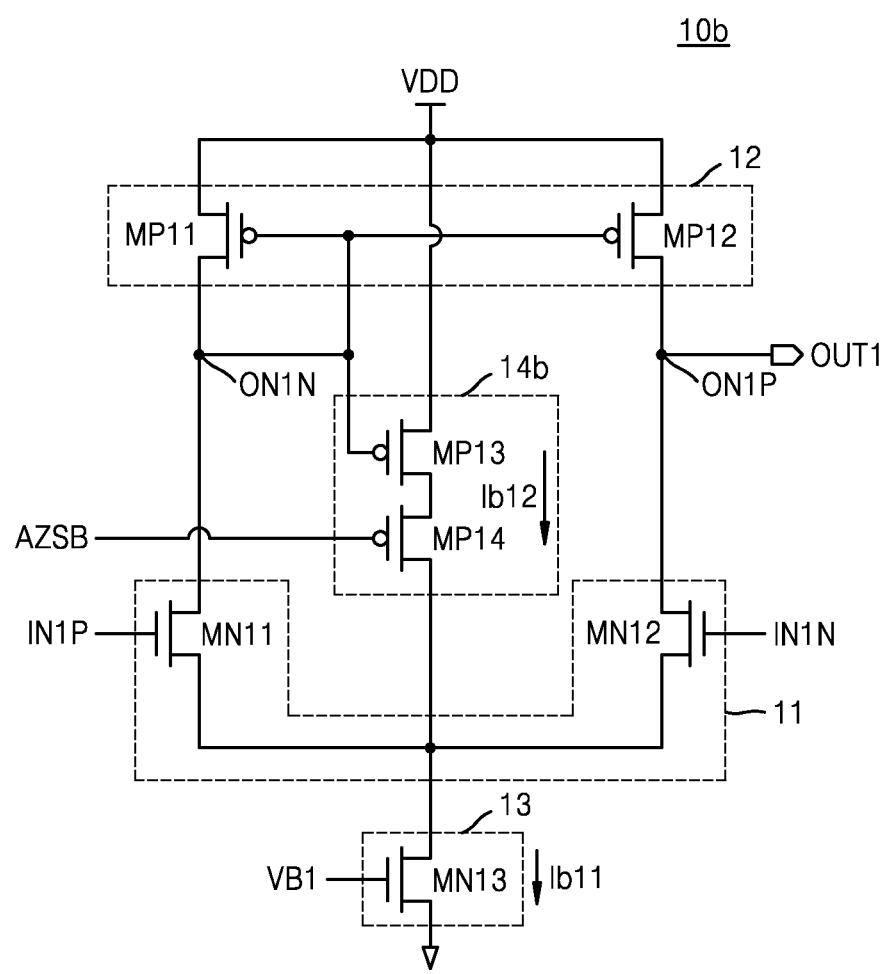

FIGS. 7A and 7B are circuit diagrams illustrating implementation examples of a first amplifier according to an exemplary embodiment of the inventive concept. For example, FIGS. 7A and 7B illustrate implementation examples of the second current source 14 of FIG. 5 according to an exemplary embodiment of the inventive concept. For convenience of explanation, a further description of elements previously described may be omitted herein.

Referring to FIG. 7A, in an exemplary embodiment, a second current source 14a of a first amplifier 10a includes transistors MP13 and MP14. The transistor MP13 may be, for example, a bias transistor, and the power supply voltage VDD may be applied to a source of the transistor MP13. The transistor MP13 may generate the second bias current Ib12 based on a second bias voltage VB2.

The transistor MP14 may be, for example, a switching transistor, and may be turned on or off in response to a synchronous signal of the auto-zero signal (see AZS of FIG. 5), for example, to an auto-zero bar signal AZSB. The auto-zero bar signal AZSB may be an inverse signal (phase inverse signal) of the auto zero signal AZS. In the auto-zero period, when the auto-zero signal AZS is activated to a high level, the auto-zero bar signal AZSB may be activated to a low level. Thus, in the auto-zero period, the transistor MP14 may be turned on, and the transistor MP13 may generate the second bias current Ib12 based on the second bias voltage VB2.

The second bias current Ib12 generated by the transistor MP13 is sunk by the transistor MN13. That is, a portion of a current generated by the first current source 13, that is, a portion of the first bias current Ib11 sunk by the transistor MP13, may be provided by the second current source 14a.

Thus, an amount of the bias current flowing through the input stage 11 and the output stage 12 in the auto-zero period is less than that of the first bias current Ib11 flowing through the input stage 11 and the output stage 12 in the comparison operation period.

Referring to FIG. 7B, in an exemplary embodiment, a second current source 14b of a first amplifier 10b includes the transistors MP13 and MP14. The power supply voltage VDD may be applied to the source of the transistor MP13, and a gate of the transistor MP13 may be connected to the second output node ON1N. Thus, the second bias current Ib12 may be determined by a size ratio between the transistor MP13 and the transistor MP11. For example, when a size (for example, a width) of the transistor MP11 is equal to a size of the transistor MP12, and a size of the transistor MP13 is N times the size of the transistor MP11 (where N is a natural number), the amount of the second bias current Ib12 may be represented by Ib11*(N/(2+N)).

As such, a first amplifier 10b of FIG. 7B according to an exemplary embodiment of the inventive concept may generate the second bias current Ib12, the amount of which is determined by a size ratio between the transistors MP11, MP12, and MP13, without receiving a separate bias voltage except the first bias voltage VB1 from outside the first amplifier 10b.

Figure 8:
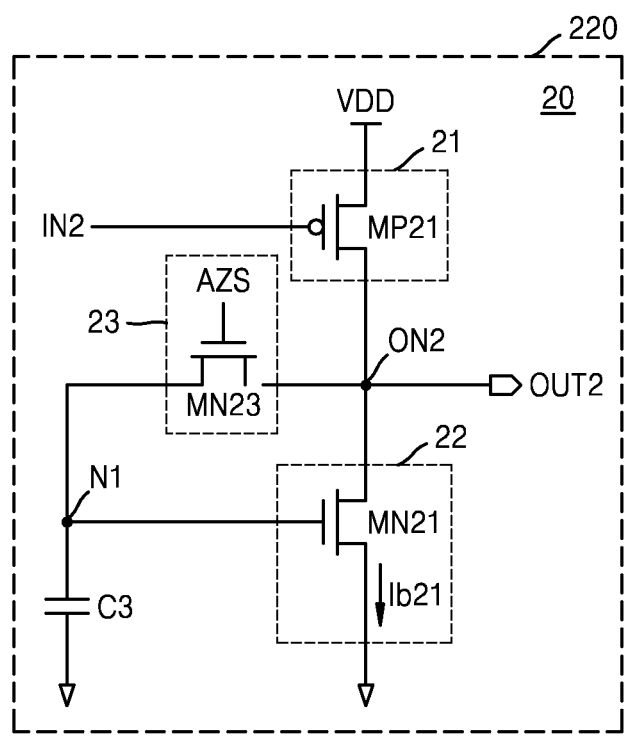
FIG. 8 is a circuit diagram illustrating a second comparison circuit according to an exemplary embodiment of the inventive concept.

FIG. 8 is a circuit diagram illustrating a second comparison circuit according to an exemplary embodiment of the inventive concept.

Referring to FIG. 8, a second comparison circuit 220 may be implemented with a second amplifier 20. In an exemplary embodiment, the second amplifier 20 includes an input stage 21, a current source 22, a switching circuit 23, and a capacitor C3, and may have a current source (CS) type inverter structure. The second amplifier 20 may further include other components not illustrated in FIG. 8.

The input stage 21 may include a transistor MP21 to which the power supply voltage VDD is applied, the transistor MP21 being connected to an output node ON2. The input stage 21 may receive, as an input IN2, the first output OUT1 of the first amplifier (see 10 of FIG. 5) or the first output OUT1 of the first comparator (see 210 of FIG. 4).

The current source 22 may include a transistor MN21 connected to the output node ON2. The transistor MN21 may generate a third bias current Ib21 based on a voltage of a bias node N1, that is, a voltage of one end of the capacitor C3.

The switching circuit 23 may include a transistor MN23 connected between the output node ON2 and the bias node N1. The transistor MN23 may be operated in response to the auto-zero signal AZS, and may be turned on in response to the activated auto-zero signal AZS in the auto-zero period. Thus, in the auto-zero period, a voltage level of the bias node N1 may be about equal to a voltage level of the output node ON2, that is, the level of the auto-zero voltage Vaz. In the operation period, the transistor MN23 may be turned off, and the voltage of the bias node N1 set in the auto-zero period may be maintained by the capacitor C3. Thus, the current source 22 may be operated.

In the comparison operation period, the second amplifier 20 may be operated as an inverter. When a voltage level of the input IN2 is increased, the voltage level of the output node ON2 may be reduced.

Figure 9A:
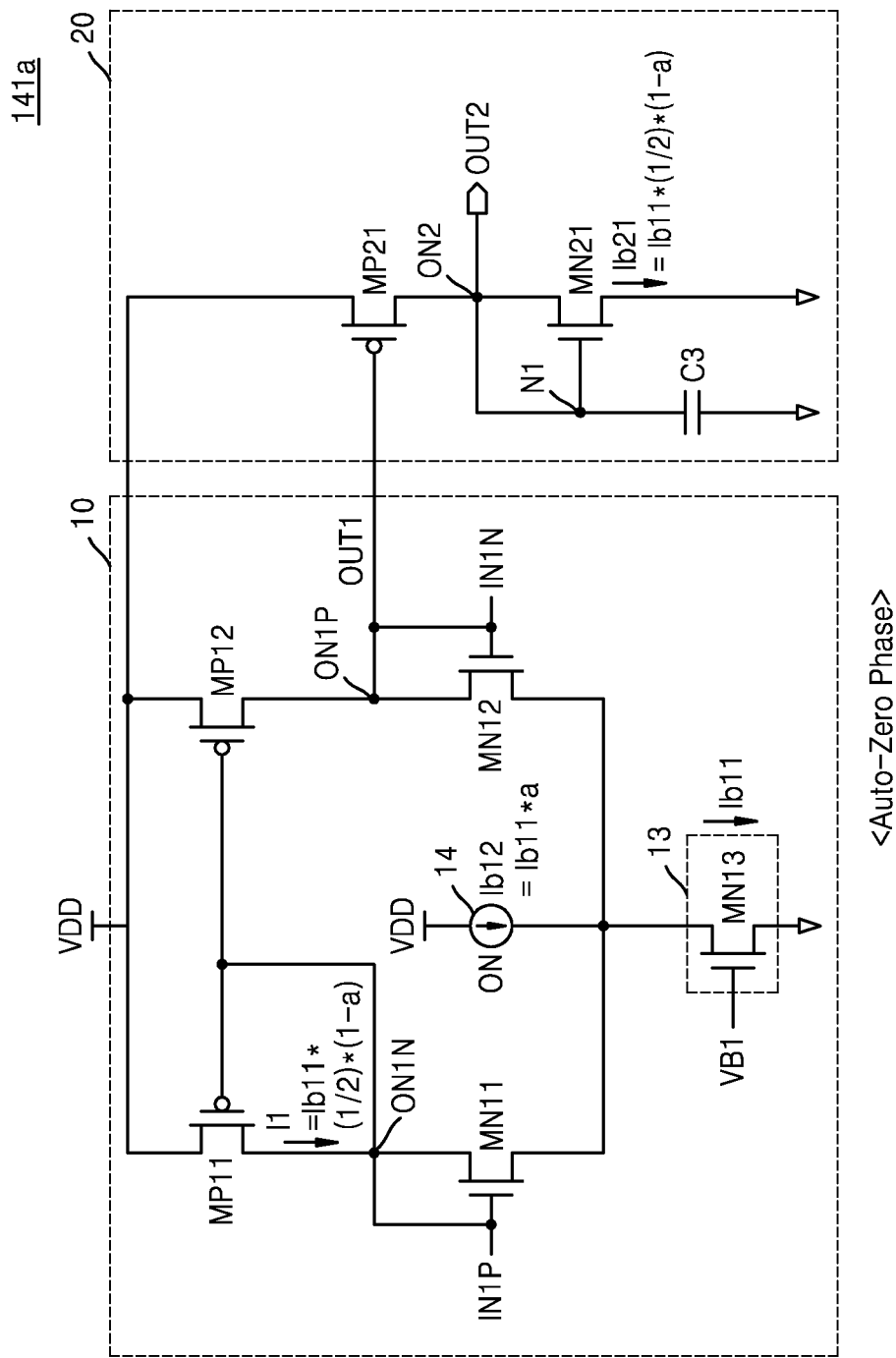
FIGS. 9A and 9B are diagrams illustrating operations of a comparison circuit according to an exemplary embodiment of the inventive concept.
Figure 9B:
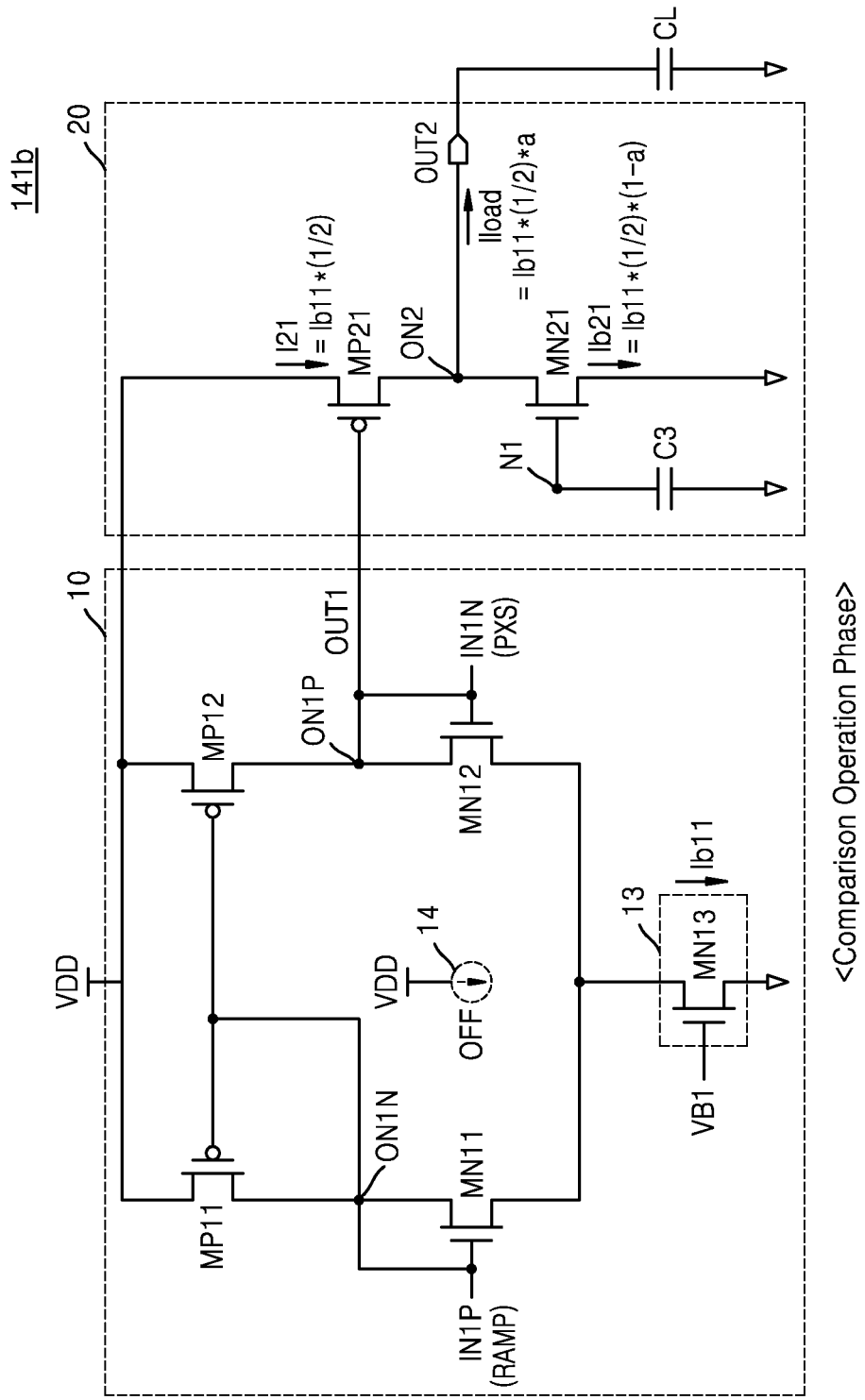

FIGS. 9A and 9B are diagrams illustrating operations of a comparison circuit according to an exemplary embodiment of the inventive concept. FIG. 9A illustrates an auto-zero phase (also referred to herein as an auto-zero mode) of a comparison circuit 141a, and FIG. 9B illustrates a comparison operation phase (also referred to herein as a comparison operation mode) of a comparison circuit 141b. In FIG. 9A, the second current source 14 is on, and in FIG. 9B, the second current source 14 is off.

Referring to FIGS. 9A and 9B, the first amplifier 10 according to an exemplary embodiment of the inventive concept, which has been described with reference to FIG. 5, may be operated as the first comparator (see 210 of FIGS. 1 and 4), and the second amplifier 20 described above with reference to FIG. 8 may be operated as the second comparator (see 220 of FIG. 2).

Referring to FIG. 9A, in the auto-zero period, the input and the output of the first amplifier 10 are connected to each other, and the bias node N1 and the output node ON2 of the second amplifier 20 are connected to each other. The first current source 13 of the first amplifier 10 generates the first bias current Ib11, and the second current source 14 of the first amplifier 10 generates the second bias current Ib12. The first current source 13 may sink the first bias current Ib11, and the second current source 14 may source the second bias current Ib12. When the second bias current Ib12 is a-times the first bias current Ib11 (where a is a real number equal to at least 1), an amount of a first current I1 flowing through the transistors MP11 and MN11 may be (½)*(1−a) times the amount of the first bias current Ib11. That is, the first current I1 may be represented by Ib11*(½)*(1−a).

A current flowing through the transistors MP12 and MN12 may also be about equal to the first current I1. In addition, when the size of the transistor MP11 of the first amplifier 10 is about equal to a size of the transistor MP21 of the second amplifier 20, the third bias current Ib21 flowing through the transistors MP21 and MN21 of the second amplifier 20 may also be about equal to the first current I1 due to current mirroring. That is, the third bias current Ib21 may be represented by Ib11*(½)*(1−a). In the auto-zero period, the voltage level of the bias node N1 may be set.

Referring to FIG. 9B, in the operation period, the second current source 14 of the first amplifier 10 stops operating. Thus, the first amplifier 10 is operated based on the first bias current Ib11. Due to current mirroring, a second current I21 flowing through the transistor MP21 of the second amplifier 20 may be about half the value of the first bias current Ib11. That is, the second current I21 may be represented by Ib11*(½).

The voltage level of the bias node N1 may be maintained identically to that in the auto-zero period. Thus, the third bias current Ib21 flowing through the transistor MN21 may also be maintained. In addition, a load current ILoad corresponding to a difference between the second current I21 and the third bias current Ib21 may be output to outside of the second amplifier 20, for example, to a load capacitor CL. Thus, a current driving capability of the second amplifier 20 may be improved, and a response speed when an output of the second amplifier 20 (e.g., the second output OUT2) is changed from a low level to a high level may be improved. For example, as the input IN2 is changed from a high level to a low level, when the second output OUT2 is changed from a low level to a high level, a rate of a change in the second output OUT2 with respect to a change in the input IN2 may be improved.

Figure 10:
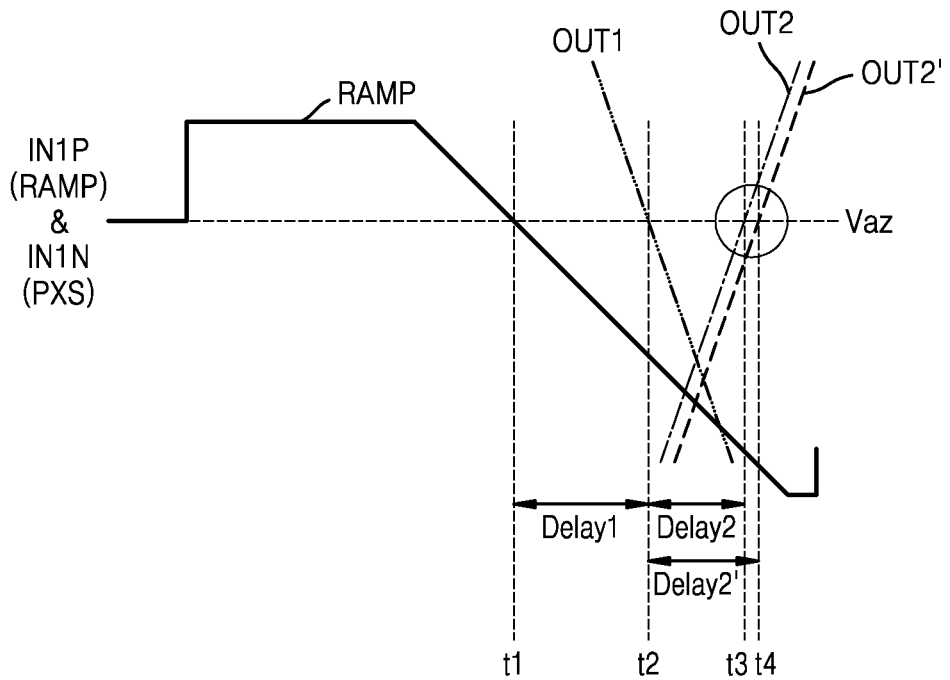
FIG. 10 is a diagram illustrating outputs of a first amplifier and a second amplifier according to an exemplary embodiment of the inventive concept.

FIG. 10 is a diagram illustrating outputs of a first amplifier and a second amplifier according to an exemplary embodiment of the inventive concept.

Referring to FIG. 10, when the reset signal is detected from the pixel signal PXS, the second input MN of the first amplifier 10 may be the auto-zero voltage Vaz, and the ramp signal RAMP may be provided to the first input IN1P of the first amplifier 10. Ideally, at the time point t1 at which the first input IN1P and the second input MN of the first amplifier 10 are about equal to each other, the output of the first amplifier 10 (e.g., the first output OUT1) is transitioned from a high level to a low level, and the output of the second amplifier 20 (e.g., the second output OUT2) is transitioned from a low level to a high level.

However, due to a delay component of the first amplifier 10, the first output OUT1 may be transitioned at the time point t2, which is delayed from the time point t1 by a first delay amount Delay1. In addition, due to a delay component of the second amplifier 20, the second output OUT2 may be transitioned at the time point t3, which is delayed by a second delay amount Delay2, from the time point t2 at which the first output OUT1 is transitioned. According to the comparison circuit according to an exemplary embodiment of the inventive concept, as described with reference to FIGS. 9A and 9B, since the current driving capability of the second amplifier 20 in the comparison operation phase is improved due to a difference in the bias current of the first amplifier 10 between the auto-zero phase and the comparison operation phase, when the second output OUT2 is changed from a low level to a high level, the response speed of the second amplifier 20 is increased. Thus, in the comparison circuit according to an exemplary embodiment of the inventive concept, a time point of transition of the second output OUT2 may be earlier than a time point (e.g., the time point t4) of transition of a second output OUT2' in the case in which there is no difference in the bias current of the first amplifier 10 between the auto-zero phase and the comparison operation phase (e.g., compare Delay2 and Delay2').

Figure 11:
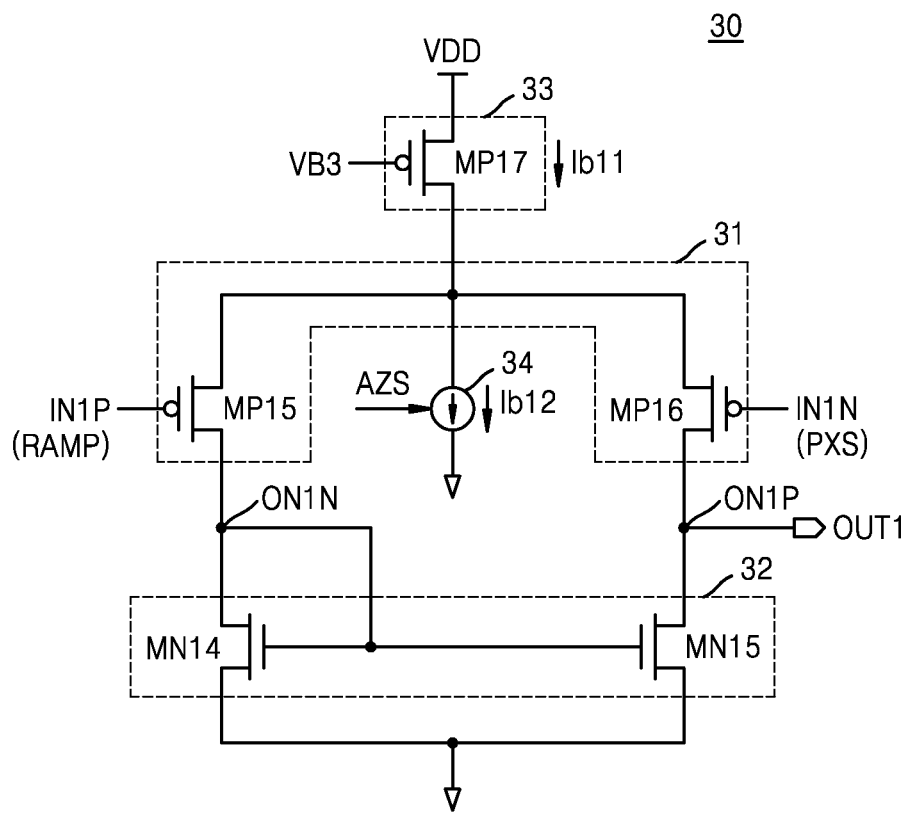
FIG. 11 is a circuit diagram of a first amplifier according to an exemplary embodiment of the inventive concept.

FIG. 11 is a circuit diagram of a first amplifier according to an exemplary embodiment of the inventive concept.

Referring to FIG. 11, in an exemplary embodiment, a first amplifier 30 includes an input stage 31, an output stage 32, a first current source 33, and a second current source 34. The configuration and operation of the first amplifier 30 of FIG. 11 are similar to the configuration and operation of the first amplifier 10 of FIG. 5. Accordingly, a further description of elements previously described with reference to FIG. 5 may be omitted herein. In the first amplifier 10 of FIG. 5, the first current source 13 and the input stage 11 are implemented with N-type MOSFETs, and the second current source 14 and the output stage 12 are implemented with P-type MOSFETs. In contrast, in the first amplifier 30 of FIG. 11, the first current source 33 and the input stage 31 are implemented with P-type MOSFETs, and the second current source 34 and the output stage 32 are implemented with N-type MOSFETs. For example, the input stage 31 includes transistors MP15 and MP16, and the output stage 32 includes transistors MN14 and MN15.

Referring to FIG. 11, in an exemplary embodiment, the ramp signal RAMP is provided as the first input IN1P, and the pixel signal PXS is provided as the second input IN1N. When the ramp signal RAMP (e.g., the first input IN1P) is lower than the second input IN1N, the output of the first amplifier (e.g., the first output OUT1) is transitioned to a low level.

The first current source 33 may include a transistor MP17. The transistor MP17 may be connected to the power supply voltage VDD, and may generate the first bias current Ib11 based on a third bias voltage VB3. The second current source 34 may be operated in response to the auto-zero signal AZS (or a synchronous signal of the auto-zero signal), and may generate the second bias current Ib12 in the auto-zero period.

Figure 12A:
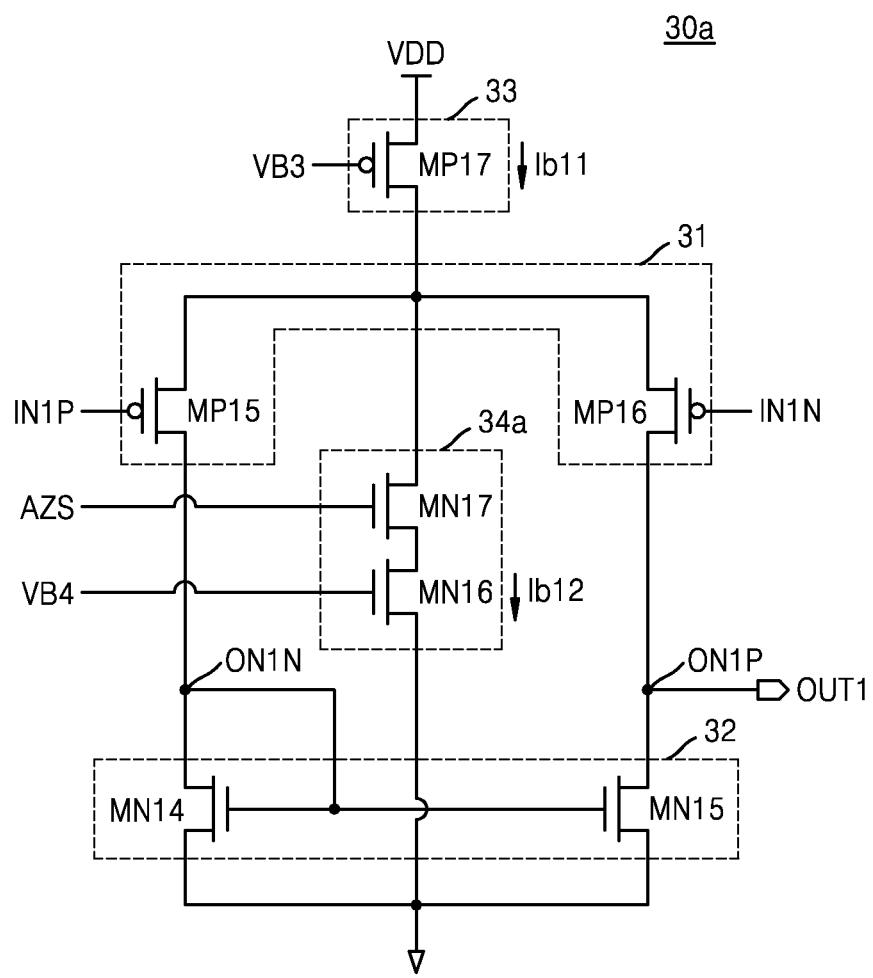
FIGS. 12A and 12B are circuit diagrams illustrating implementation examples of a first amplifier according to an exemplary embodiment of the inventive concept.
Figure 12B:
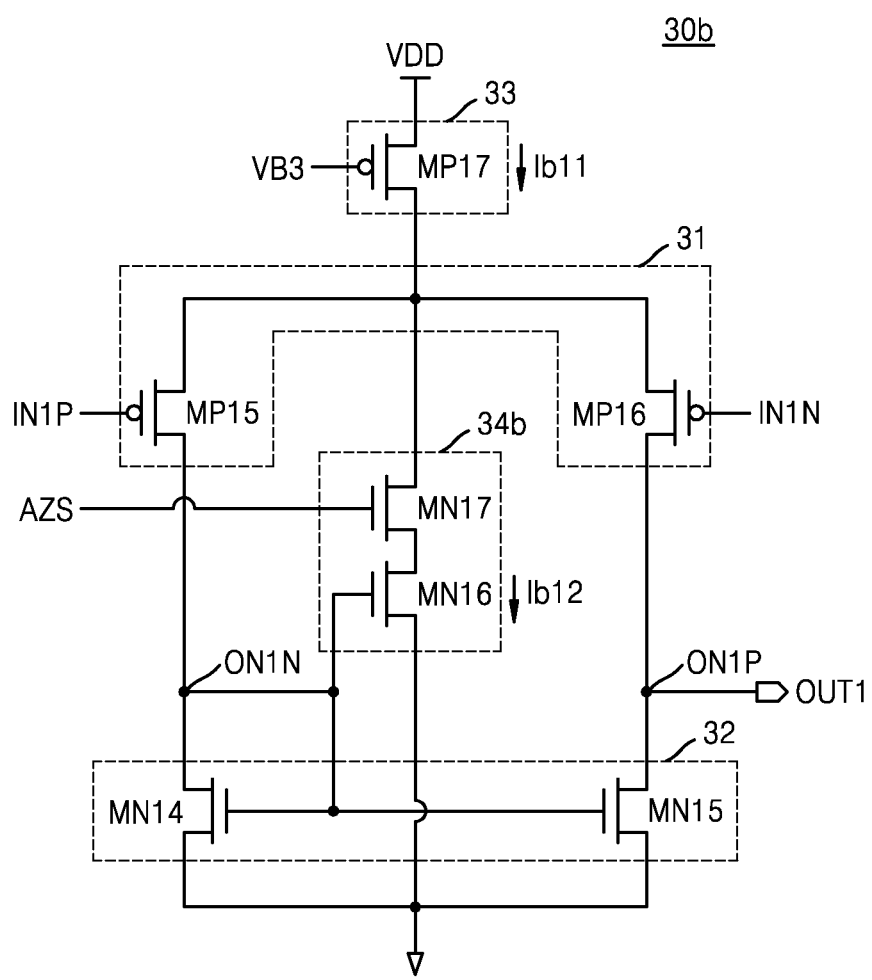

FIGS. 12A and 12B are circuit diagrams illustrating implementation examples of a first amplifier according to an exemplary embodiment of the inventive concept. For example, FIGS. 12A and 12B illustrate implementation examples of the second current source 34 of FIG. 11. For convenience of explanation, a further description of elements previously described may be omitted herein.

Referring to FIG. 12A, in an exemplary embodiment, a second current source 34a of a first amplifier 30a includes transistors MN16 and MN17. Each of the transistors MN16 and MN17 may be, for example, an N-type MOSFET. In an exemplary embodiment, the transistor MN16 is a bias transistor, and the ground voltage VSS is applied to a source of the transistor MN16. The transistor MN16 may generate the second bias current Ib12 based on a fourth bias voltage VB4.

The transistor MN17 is a switching transistor, and may be turned on or off in response to the auto-zero signal AZS. For example, when the auto-zero signal AZS is activated to a high level in the auto-zero period, the transistor MN17 is turned on, and the transistor MN16 generates the second bias current Ib12 based on the fourth bias voltage VB4.

The second bias current Ib12 provided by the transistor MN16 is sourced by the transistor MP17. For example, a portion of a current generated by the first current source 33 (e.g., a portion of the first bias current Ib11 sourced by the transistor MP17) may be sunk by the second current source 34a. Thus, the amount of the bias current flowing through the input stage 31 and the output stage 32 in the auto-zero period is less than that of the first bias current Ib11 flowing through the input stage 31 and the output stage 32 in the comparison operation period.

Referring to FIG. 12B, in an exemplary embodiment, a second current source 34b of a first amplifier 30b includes the transistors MN16 and MN17. The ground voltage VSS may be applied to the source of the transistor MN16, and a gate thereof may be connected to the second output node ON1N. Thus, the second bias current Ib12 may be determined by a size ratio between the transistor MN14 and the transistor MN16.

Figure 13:
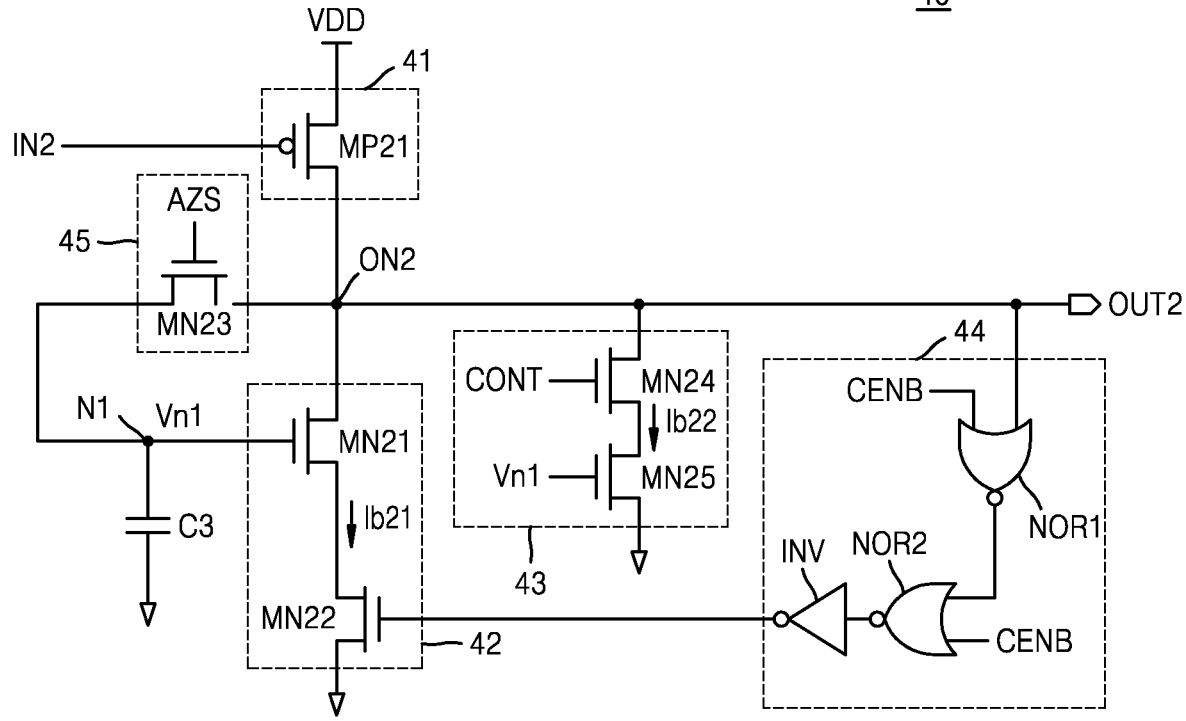
FIG. 13 is a circuit diagram illustrating a second amplifier according to an exemplary embodiment of the inventive concept.

FIG. 13 is a circuit diagram illustrating a second amplifier according to an exemplary embodiment of the inventive concept.

Referring to FIG. 13, in an exemplary embodiment, a second amplifier 40 includes an input stage 41, a first current source 42, a second current source 43, control logic 44 (also referred to as a control logic circuit), and a switching circuit 45. For convenience of explanation, a further description of elements previously described may be omitted herein.

The input stage 41 may include a transistor MP21 to which the power supply voltage VDD is applied. The transistor MP21 is connected to the output node ON2. The input stage 41 may receive, as the input IN2, the first output OUT1 of the first amplifier (see 10 of FIG. 5) or the first comparator (see 210 of FIG. 4).

The first current source 42 may include the transistor MN21 connected to the output node ON2, and a transistor MN22 to which the ground voltage VSS is applied. The transistor MN22 is connected to the transistor MN21. The transistor MN21 may generate the third bias current Ib21 based on a bias voltage Vn1 of the bias node N1.

In an exemplary embodiment, the second current source 43 includes a transistor MN24 connected to the output node ON2, and a transistor MN25 to which the ground voltage VSS is applied. The transistor MN25 is connected to the transistor MN24. When the transistor MN24 is turned on in response to a bias control signal CONT, the transistor MN25 generates a fourth bias current Ib22 based on the bias voltage Vn1. In an exemplary embodiment, the fourth bias current Ib22 is greater than the third bias current Ib21. In an exemplary embodiment, the connection configuration of the transistor MN24 and the transistor MN25 may vary. For example, in an exemplary embodiment, the transistor MN24 may be connected to the output node ON2, and the ground voltage VSS may be applied to a source of the transistor MN25.

The control logic 44 may include a plurality of logic gates. For example, the control logic 44 may include a first NOR gate NOR1, a second NOR gate NOR2, and an inverter INV. However, it is to be understood that this configuration is exemplary, and that the control logic 44 may be configured in various other manners. For example, the configuration of the control logic 44 may be variously changed within a range that enables the logic results of FIGS. 14A to 14F described below to be obtained.

The switching circuit 45 may include the transistor MN23 connected between the output node ON2 and the bias node N1. The transistor MN23 may be operated in response to the auto-zero signal AZS, and may be turned on in response to the activated auto-zero signal AZS in the auto-zero period. Thus, in the auto-zero period, the voltage level of the bias node N1 may be about equal to the voltage level of the output node ON2. In the operation period, the transistor MN23 may be turned off, the voltage of the bias node N1 set in the auto-zero period (e.g., the bias voltage Vn1) may be maintained by the capacitor C3, and the first current source 42 and the second current source 43 may respectively generate the third bias current Ib21 and the fourth bias current Ib22 based on the bias voltage Vn1.

The second amplifier 40 has a CS type inverter structure in which the input stage 41 and the first and second current sources 42 and 43 form an inverter. The second amplifier 40 having the CS type inverter structure has a simplified structure and exhibits low power consumption and a fast response speed. However, when the input stage 41 and the first and second current sources 42 and 43 are turned on (e.g., when the input IN2 is at a low level, for example, at a level lower than that of the auto-zero voltage Vaz), a power fluctuation may occur due to a short-circuit current. For example, since a large amount of a current flows through the second amplifier 40, a level of the power supply voltage VDD or the ground voltage VSS may fluctuate, and thus, deterioration in image quality may occur.

However, the second amplifier 40 according to the present exemplary embodiment may block the generation of a short-circuit current. For example, when the input IN2 is at a low level (e.g., at a level lower than the auto-zero voltage Vaz), for example, after a phase in which the second output OUT2 of the second amplifier 40 is changed from a low level to a high level (hereinafter, the phase will be referred to as a low-high decision phase), the second amplifier 40 prevents the bias current from flowing, thereby blocking the generation of a short-circuit current.

Hereinafter, operations of the second amplifier 40 according to an exemplary embodiment of the inventive concept will be described in detail with reference to FIGS. 14A to 15.

FIGS. 14A to 14F are diagrams illustrating operations of a second amplifier, phase by phase. FIG. 15 is a waveform diagram of the second amplifier.

Figure 14A:
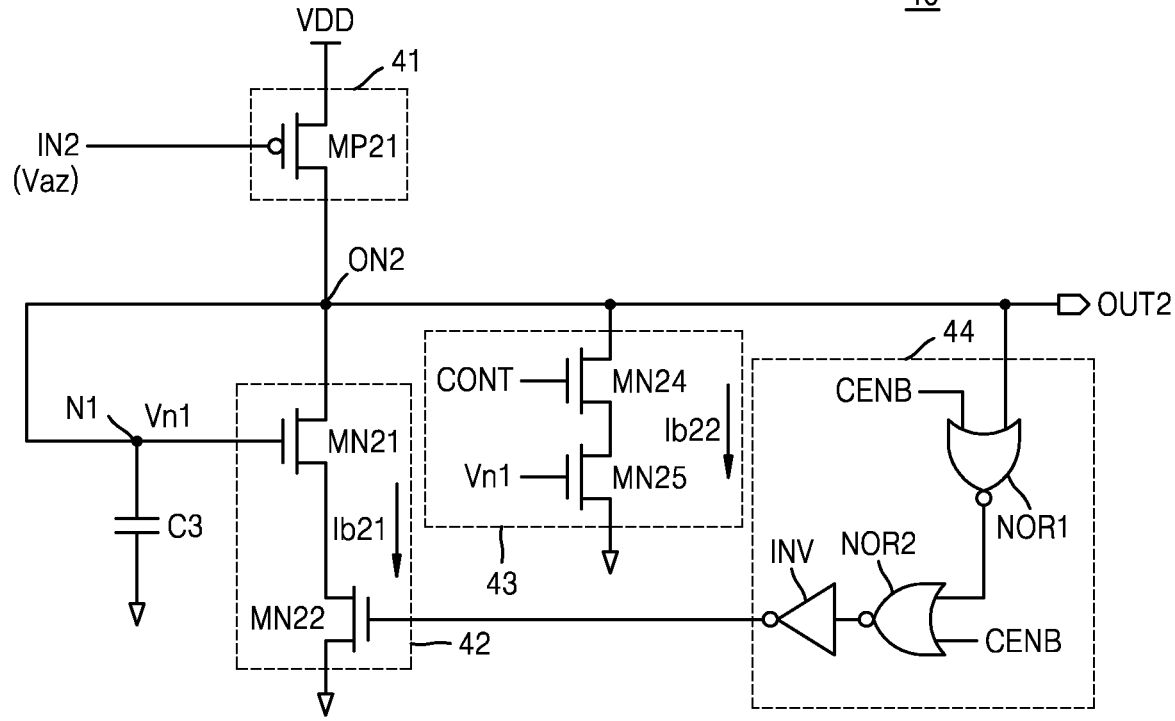
FIGS. 14A to 14F are diagrams illustrating operations of the second amplifier of FIG. 13, phase by phase.
Figure 14B:
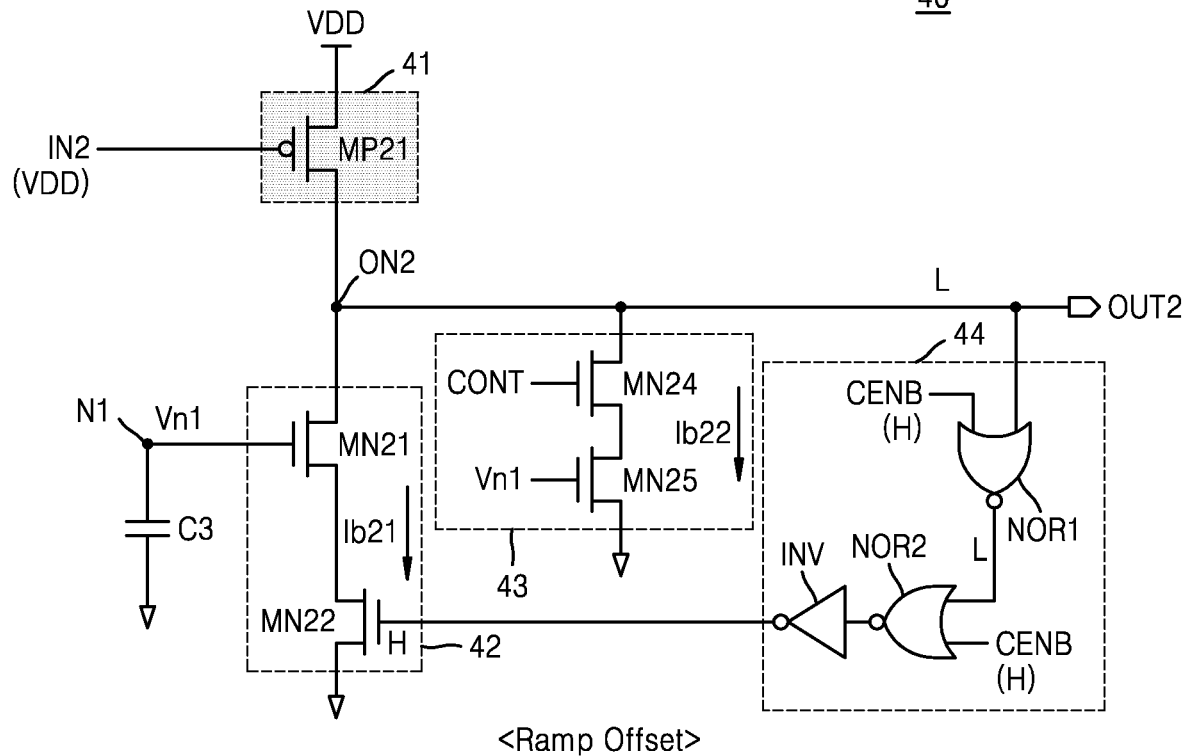
Figure 14C:
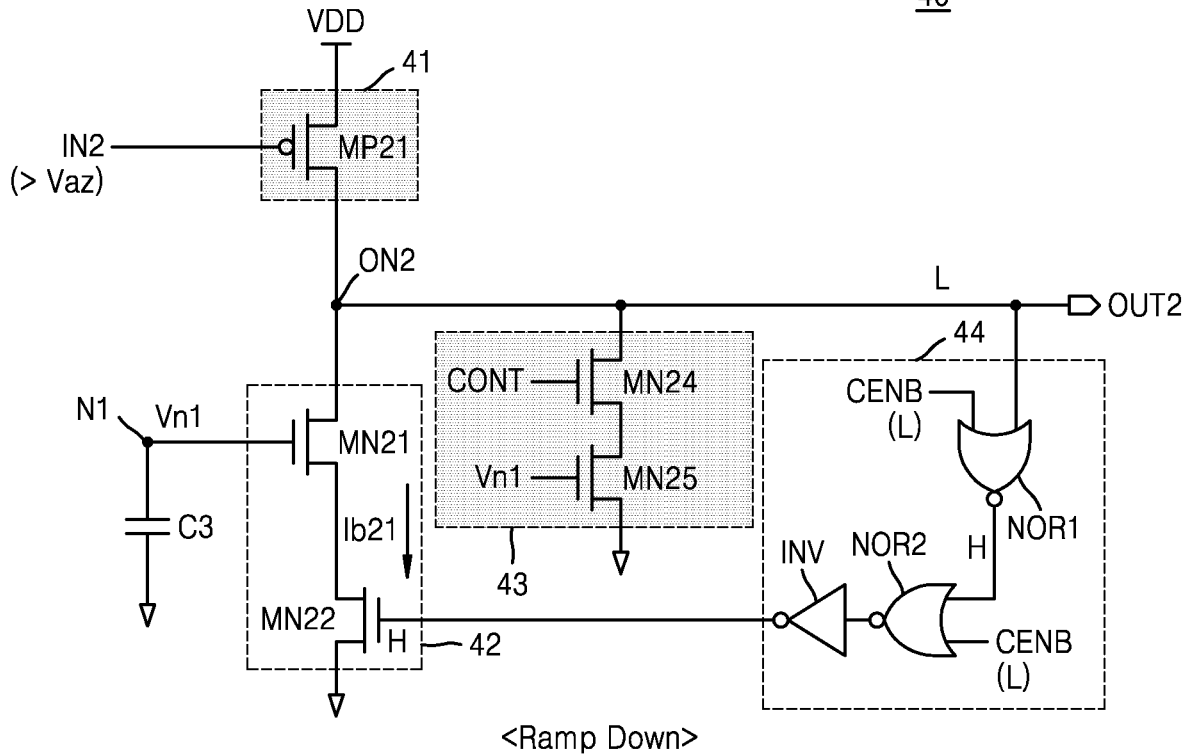
Figure 14D:
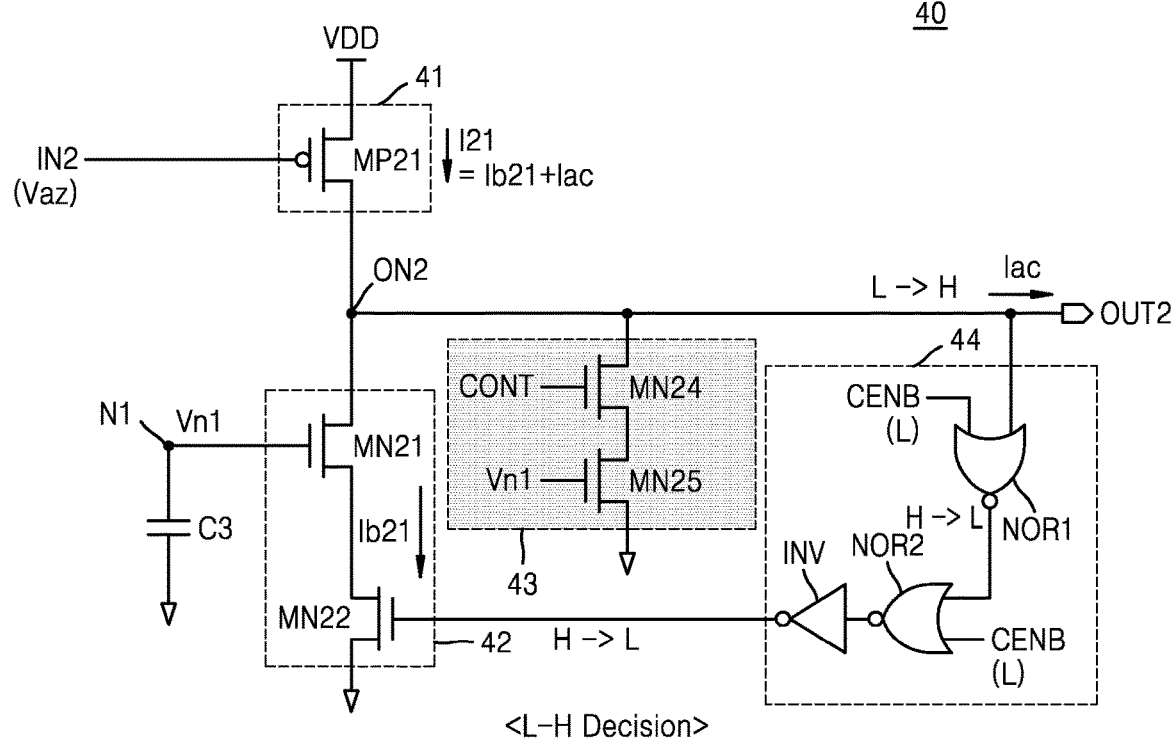
Figure 14E:
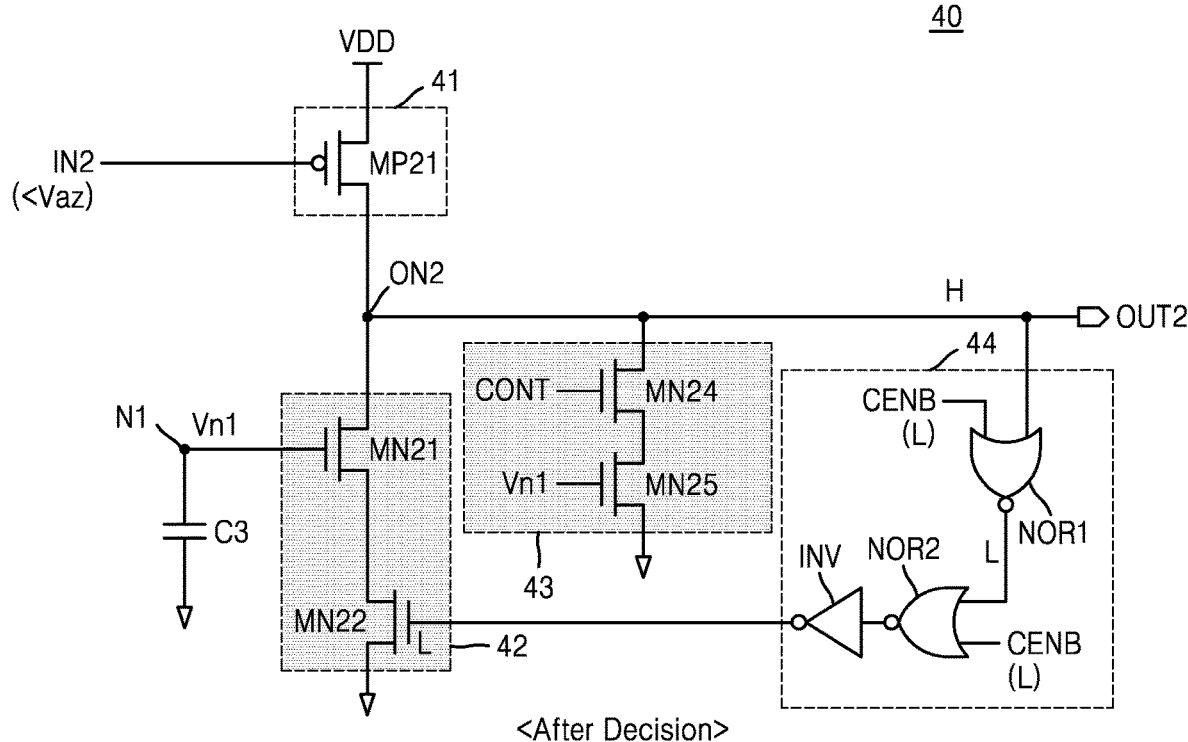
Figure 14F:
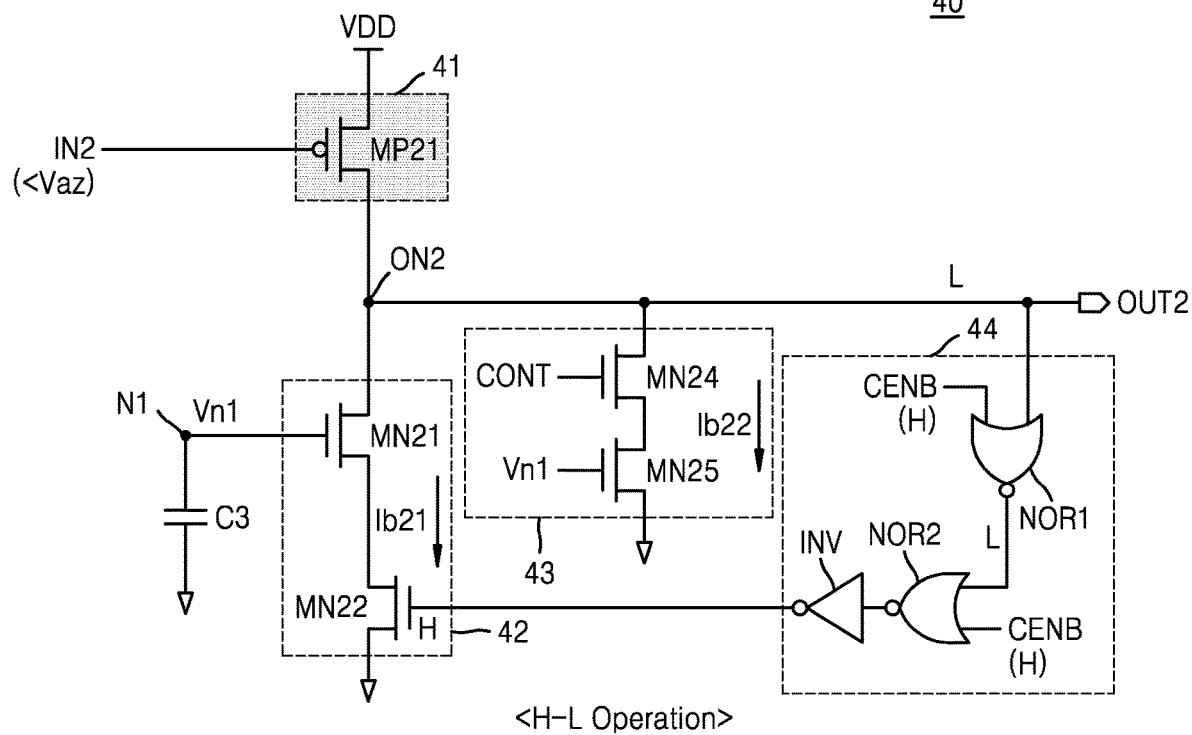
Figure 15:
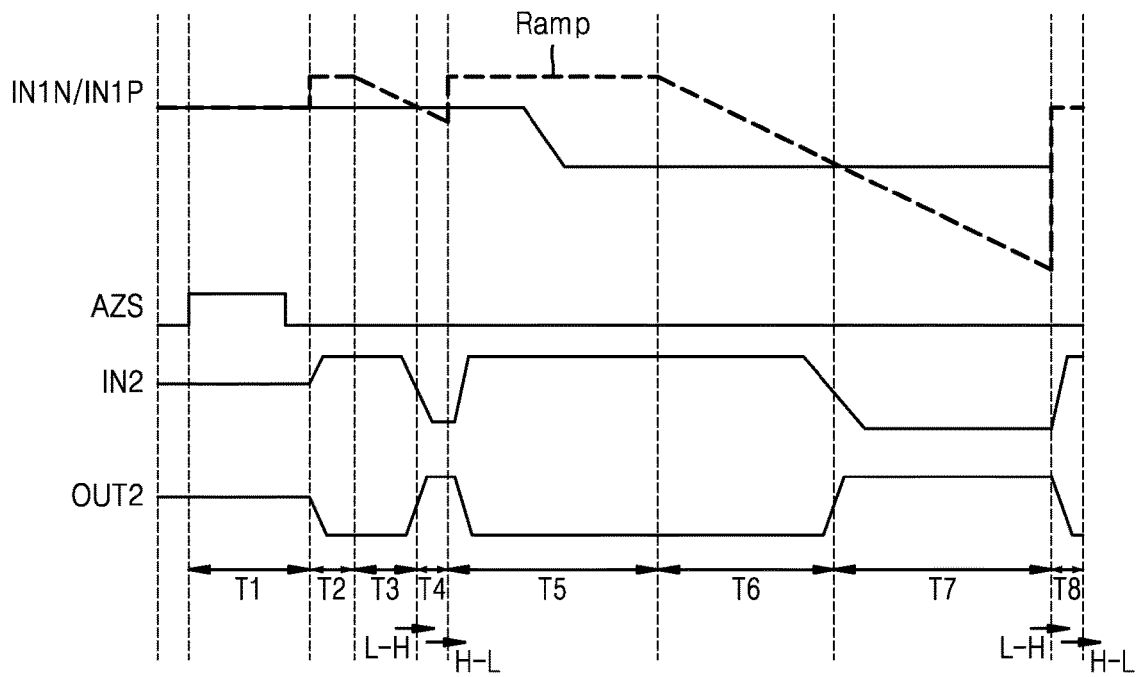
FIG. 15 is a waveform diagram of the second amplifier of FIG. 13.

In FIGS. 14A to 14F and 15, 'L' signifies a signal at a low level, and 'H' signifies a signal at a high level. In FIG. 15, eight periods T1 through T8 are illustrated.

Referring to FIGS. 15 and 14A, in a first period T1, the auto-zero phase is performed. The transistor MN23 of the switching circuit (see 45 of FIG. 14) is turned on in response to the activated auto-zero signal AZS, and the bias node N1 and the output node ON2 are connected to each other. The input IN2 and the output node ON2 may be at the level of the auto-zero voltage Vaz. Thus, the first current source 42 may generate the third bias current Ib21. In addition, the bias control signal is activated (for example, a high level), and the second current source 43 generates the fourth bias current Ib22. Thus, in the auto-zero phase, the third bias current Ib21 and the fourth bias current Ib22 may flow through the second amplifier 40. An amount of the fourth bias current Ib22 may be greater than that of the second bias current Ib21.

Referring to FIGS. 15 and 14B, in a second period T2, an offset is applied to the ramp signal RAMP. The second period T2 may be referred to as a ramp offset phase. Here, a level of the input IN2 becomes higher than that of the auto-zero voltage Vaz. For example, a level of the input IN2 may be in proximity to the level of the power supply voltage VDD. Thus, the input stage 41 is turned off. The voltage of the bias node N1 is maintained by the capacitor C3.

An output of the control logic 44 may be at a high level. A comparison enable bar signal CENB at a high level is provided, as an input, to each of the first NOR gate NOR1 and the second NOR gate NOR2, and the control logic 44 outputs a signal at a high level, regardless of a level of the output node ON2. Thus, the first current source 42 and the second current source 43 are operated. Therefore, in the ramp offset phase, the third bias current Ib21 and the fourth bias current Ib22 flow through the second amplifier 40.

Referring to FIGS. 15 and 14C, in a third period T3, the level of the ramp signal RAMP decreases. The third period T3 may be referred to as a ramp down phase. Since the level of the input IN2 is higher than that of the auto-zero voltage Vaz, the input stage 31 is maintained in a turn-off state.

In the ramp down phase, the bias control signal CONT is deactivated (e.g., the bias control signal CONT is at a low level), and the second current source 43 is turned off. In addition, the comparison enable bar signal CENB is at a low level. However, since the output node ON2 is at a low level, the output of the control logic 44 is maintained at a high level. Thus, the first current source 42 is operated. In the ramp down phase, the third bias current Ib21 flows through the second amplifier 40.

Referring to FIGS. 15 and 14D, between the third period T3 and a fourth period T4, the level of the input IN2 becomes about equal to that of the auto-zero voltage Vaz, and the second output OUT2 is transitioned from a low level to a high level. As a result, a phase in which the second output OUT2 is transitioned from a low level to a high level may be referred to as a low-high decision phase.

Since the level of the input IN2 becomes about equal to that of the auto-zero voltage Vaz, the second current source 43 is turned on. The second current I21 may flow based on a voltage difference between the power supply voltage VDD and the input IN2, and the second output OUT2 may also be at the level of the auto-zero voltage Vaz. Thus, the second output OUT2 may be transitioned from a low level to a high level.

In the low-high decision phase, the bias control signal CONT is deactivated, and the second current source 43 is turned off. In addition, the comparison enable bar signal CENB is at a low level. As the output node ON2 is transitioned from a low level to a high level, the output of the control logic 44 is transitioned from a high level to a low level. When the output of the control logic 44 is at a high level, the first current source 42 generates the third bias current Ib21. Of the second current I21 output from the input stage 41, the remaining current except the third bias current Ib21 is output as a dynamic current Iac to an outside of the second amplifier 40. Next, when the output of the control logic 44 is transitioned to a low level, the first current source 42 is turned off. Thus, the bias current, that is, a static current, does not flow through the second amplifier 40.

Referring to FIGS. 15 and 14E, in the fourth period T4, the level of the input IN2 becomes lower than that of the auto-zero voltage Vaz, and the second output OUT2 is maintained at a high level. The fourth period T4 may be referred to as an after-decision phase. As described above, since the first current source 42 and the second current source 43 are in a turn-off state, the bias current (e.g., the static current) does not flow through the second amplifier 40.

Referring to FIGS. 15 and 14F, between the fourth period T4 and a fifth period T5, the level of the ramp signal RAMP increases, and the second output OUT2 is transitioned from a high level to a low level. As a result, a phase in which the second output OUT2 is transitioned from a high level to a low level may be referred to as a high-low operation phase. Since the level of the input IN2 becomes higher than that of the auto-zero voltage Vaz, the input stage 41 is turned off. The bias control signal CONT may be activated, and the second current source 43 may generate the fourth bias current Ib22. In addition, as the comparison enable bar signal CENB at a high level is provided, as an input, to each of the first NOR gate NOR1 and the second NOR gate NOR2, the control logic 44 outputs a signal at a high level. The first current source 42 is operated and generates the third bias current Ib21. Thus, in the high-low operation phase, the third bias current Ib21 and the fourth bias current Ib22 flow through the second amplifier 40. Next, the ramp offset phase, the ramp down phase, the low-high decision phase, the after-decision phase, and the high-low operation phase, which have been described above, are repeated.

Figure 16:
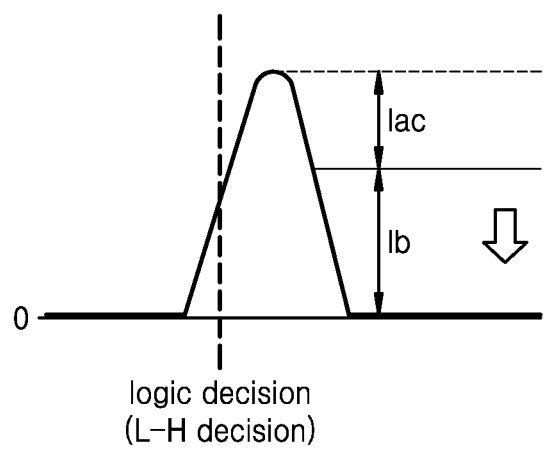
FIG. 16 is a graph depicting a static current of a second amplifier according to an exemplary embodiment of the inventive concept.

FIG. 16 is a graph depicting a static current of a second amplifier according to an exemplary embodiment of the inventive concept.

As described above with reference to FIGS. 14A to 14F, the second amplifier 40 according to an exemplary embodiment of the inventive concept includes the first current source 42, which generates a relatively small amount of the bias current (e.g., the third bias current IN21), and the second current source 43, which generates a relatively large amount of the bias current (e.g., the fourth bias current Ib22). In addition, the second amplifier 40 controls the turning on and off of the first current source 42 and the second current source 43 on an operation phase basis. Thus, the second amplifier 40 may provide a large amount of the bias current (Ib) in a phase requiring a large amount of the bias current, such as the ramp offset phase or the high-low operation phase, may provide a small amount of the bias current in a period before the low-high decision, and may cut-off the generation of the bias current in a period after the low-high decision. Therefore, as shown in FIG. 15, a current flowing through the second amplifier 40 before and after the low-high decision may be minimized.

As described above, when the input IN2 is lower in level than the auto-zero voltage Vaz, for example, after the low-high decision, a power fluctuation may occur due to a short-circuit current. However, the second amplifier 40 according to an exemplary embodiment of the inventive concept turns off the first current source 42 and the second current source 43 after the low-high decision, thereby preventing the generation of the short-circuit current. Since the power fluctuation of the second amplifier 40 is not large, in exemplary embodiments, the second amplifier 40 may share a power line with other circuits on a layout of a semiconductor chip into which the image sensor (see 100 of FIG. 1) is integrated. Therefore, since a power supply voltage pad of the semiconductor chip may be integrated, and impedance of the power line may be reduced, image quality of image data may be improved, and manufacturing costs of the semiconductor chip may be reduced.

Figure 17:
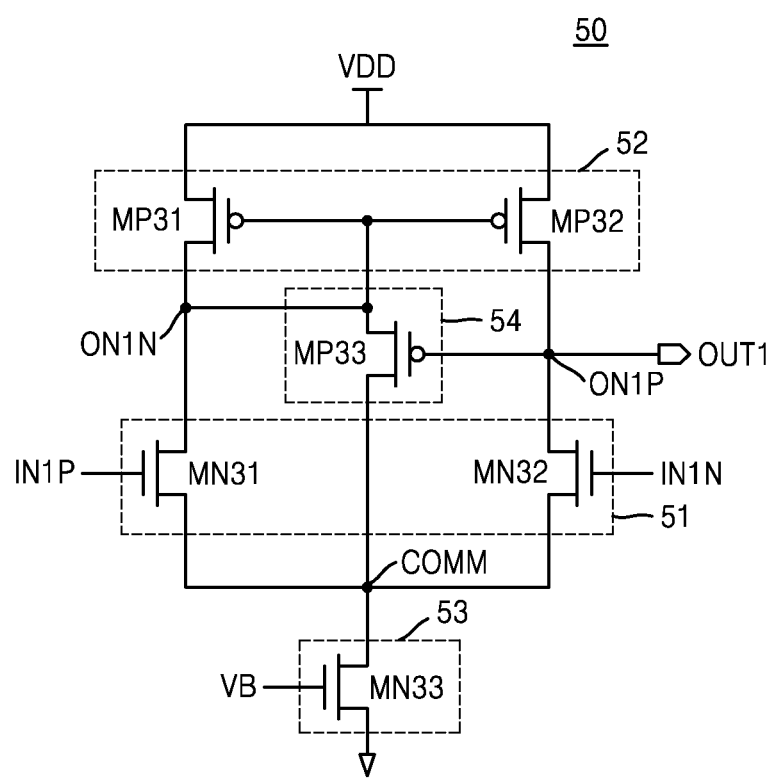
FIG. 17 is a circuit diagram of a first amplifier according to an exemplary embodiment of the inventive concept.
Figure 18A:
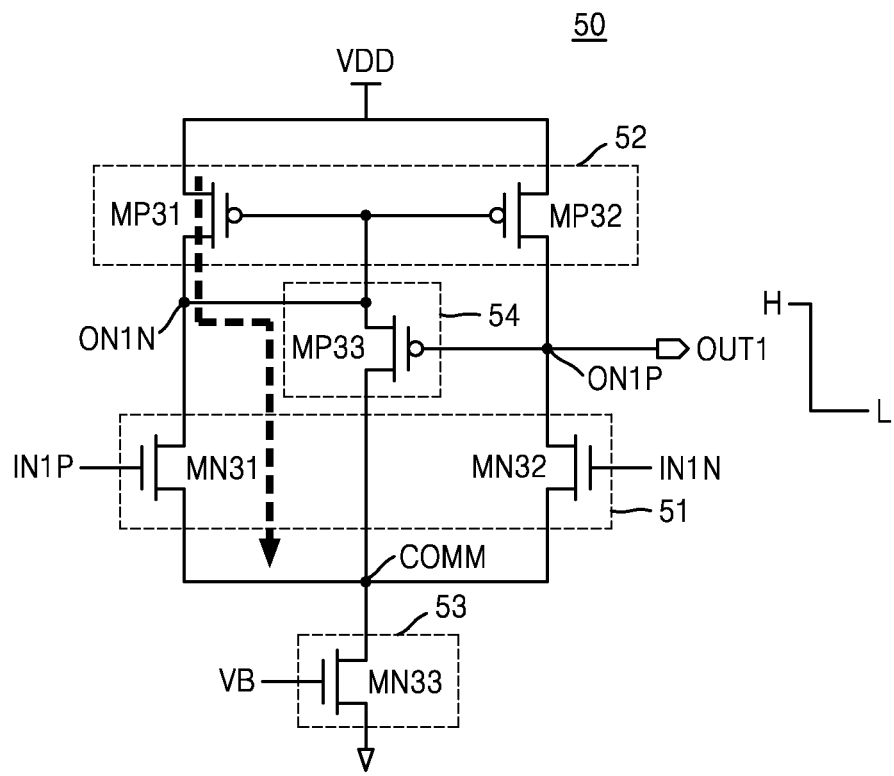
FIG. 18A is a diagram illustrating operations of the first amplifier of FIG. 17.
Figure 18B:
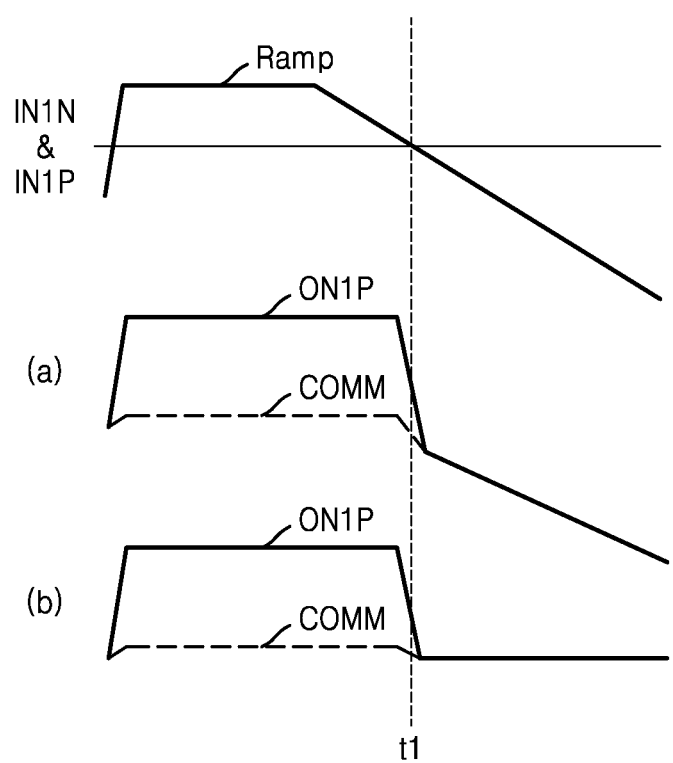
FIG. 18B is a graph depicting an output of a first amplifier in accordance with operations of a limiting circuit.

FIG. 17 is a circuit diagram of a first amplifier according to an exemplary embodiment of the inventive concept. FIG. 18A is a diagram illustrating operations of the first amplifier of FIG. 17. FIG. 18B is a graph depicting an output of the first amplifier depending upon operations of a limiting circuit.

Referring to FIG. 17, in an exemplary embodiment, a first amplifier 50 includes an input stage 51, an output stage 52, a current source 53, and a limiting circuit 54. Configurations and operations of the input stage 51, the output stage 52, and the current source 53 are identical to those of the input stage 11, the output stage 12, and the current source 13 of the first amplifier 10 of FIG. 5. Therefore, for convenience of explanation, a further description of these elements and other elements previously described may be omitted herein.

The limiting circuit 54 may include a transistor MP33. A source of the transistor MP33 may be connected to the second output node ON1N. A gate of the transistor MP33 may be connected to the first output node ON1P. A drain of the transistor MP33 may be connected to the common node COMM.

The limiting circuit 54 may limit a swing width of the first output OUT1. In addition, when the first output OUT1 is transitioned from a high level to a low level, the limiting circuit 54 may compensate a voltage fluctuation of the second output node ON1N, which occurs due to discharge of a load capacitor of the first output node ON1P.

The input stage 51 may include transistors MN31 and MN32, the output stage may include transistors MP31 and MP32, and the current source may include transistor MN33.

As shown in FIG. 18A, when the first output OUT1 is transitioned from a high level to a low level, the limiting circuit 54 forms a current path between a drain of the transistor MP31 and the common node COMM, thereby allowing a current flowing through the transistor MP31 to be bypassed. Therefore, the transistor MN31 is turned off, and a level of the common node COMM may be prevented from being reduced below that of a saturation voltage of the transistor MN33.

Referring to FIG. 18B, after the level of the first output node ON1P is transitioned from a high level to a low level at a time point t1, the level of the first output node ON1P becomes about equal to the level of the common node COMM. The level of the common node COMM may be determined by a level of a first input node IN1P to which the ramp signal is input.

When the limiting circuit 54 is not present, as shown in section (a) of FIG. 18B, as the ramp signal RAMP decreases, the level of each of the common node COMM and the first output node ON1P decreases. If the level of the common node COMM decreases below that of the saturation voltage of the transistor MN33, noise may be generated as the bias current is changed.

However, as described above, the limiting circuit 54 allows the current flowing through the transistor MP31 to be bypassed, and thus, allows the transistor MN31, to which the ramp signal RAMP is applied, to be turned off. Thus, as shown in section (b) of FIG. 18B, the level of the common node COMM may be prevented from being reduced below a minimum value, for example, below the level of the saturation voltage of the transistor MN33.

Figure 19:
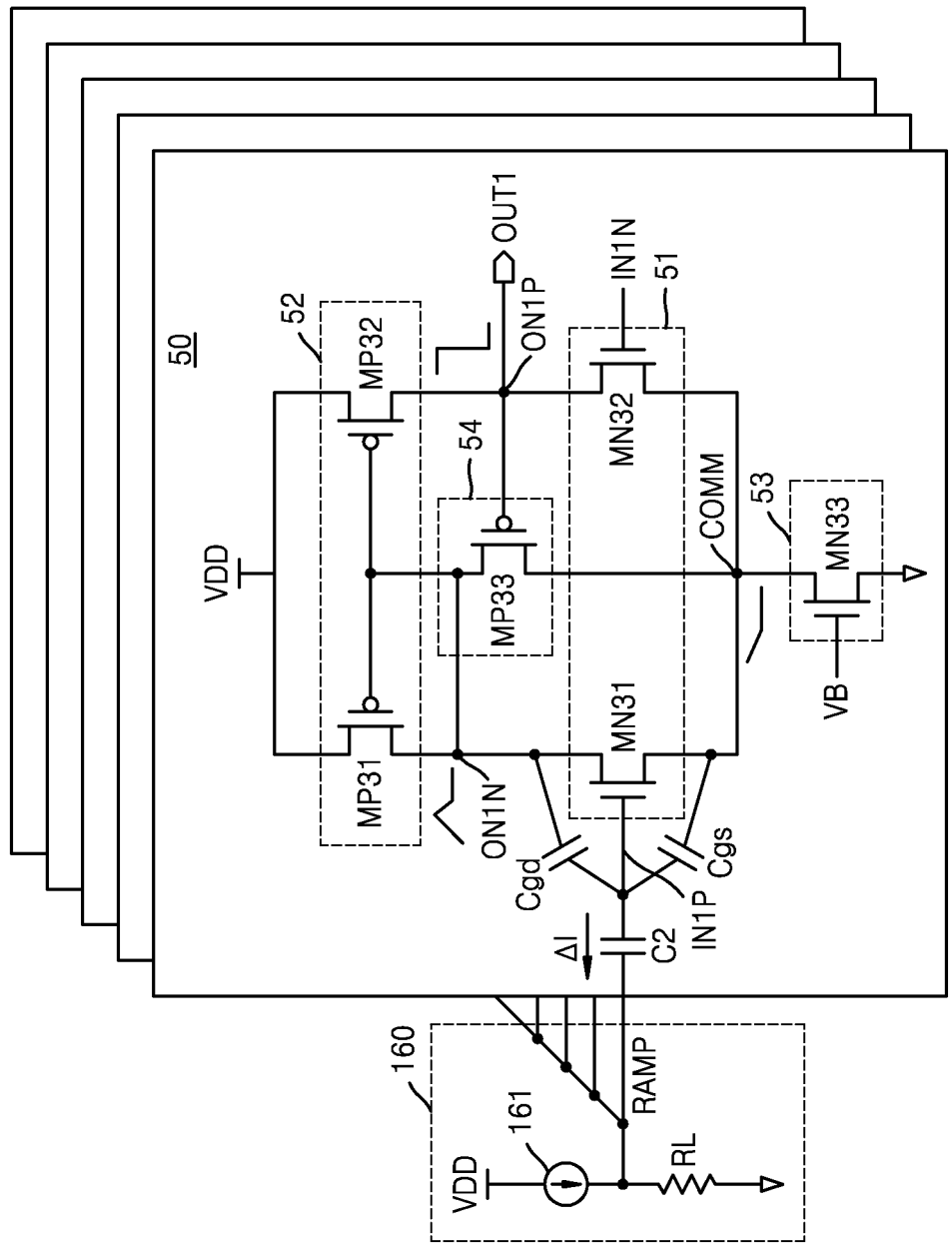
FIG. 19 is a diagram illustrating compensation of an output node voltage fluctuation in the first amplifier of FIG. 17.

FIG. 19 is a diagram illustrating compensation of an output node voltage fluctuation in the first amplifier of FIG. 17.

Referring to FIG. 19, when the first output OUT1 is transitioned from a high level to a low level, a voltage fluctuation may occur at the second output node ON1N due to discharge of the load capacitor of the first output node ON1P. The second output node ON1N may be connected to the ramp generator 160 via a parasitic capacitor Cgd, and a kickback noise current ΔI may flow into the ramp generator 160 due to the voltage fluctuation of the second output node ON1N. Referring to FIG. 1 together with FIG. 19, since the ramp signal RAMP output from the ramp generator 160 is provided to the plurality of comparison circuits 141, the ramp generator 160 is connected to a plurality of first amplifiers 50 respectively included in the plurality of comparison circuits 141. Thus, due to kickback noise currents ΔI flowing from the plurality of first amplifiers 50 into the ramp generator 160, a fluctuation may occur in the ramp signal RAMP, and this may cause deterioration in image quality.

However, the limiting circuit 54 of the first amplifier 50 according to an exemplary embodiment of the inventive concept is directly connected to the common node COMM, and may quickly increase the level of the common node COMM when a voltage fluctuation occurs at the second output node ON1N. At the common node COMM, a voltage fluctuation may occur in an opposite direction to the voltage fluctuation of the second output node ON1N. Thus, the kickback noise current ΔI may be reduced. As a result, the limiting circuit 54 is directly connected to the common node COMM, thereby compensating the voltage fluctuation of the second output node ON1N.

Figure 20:
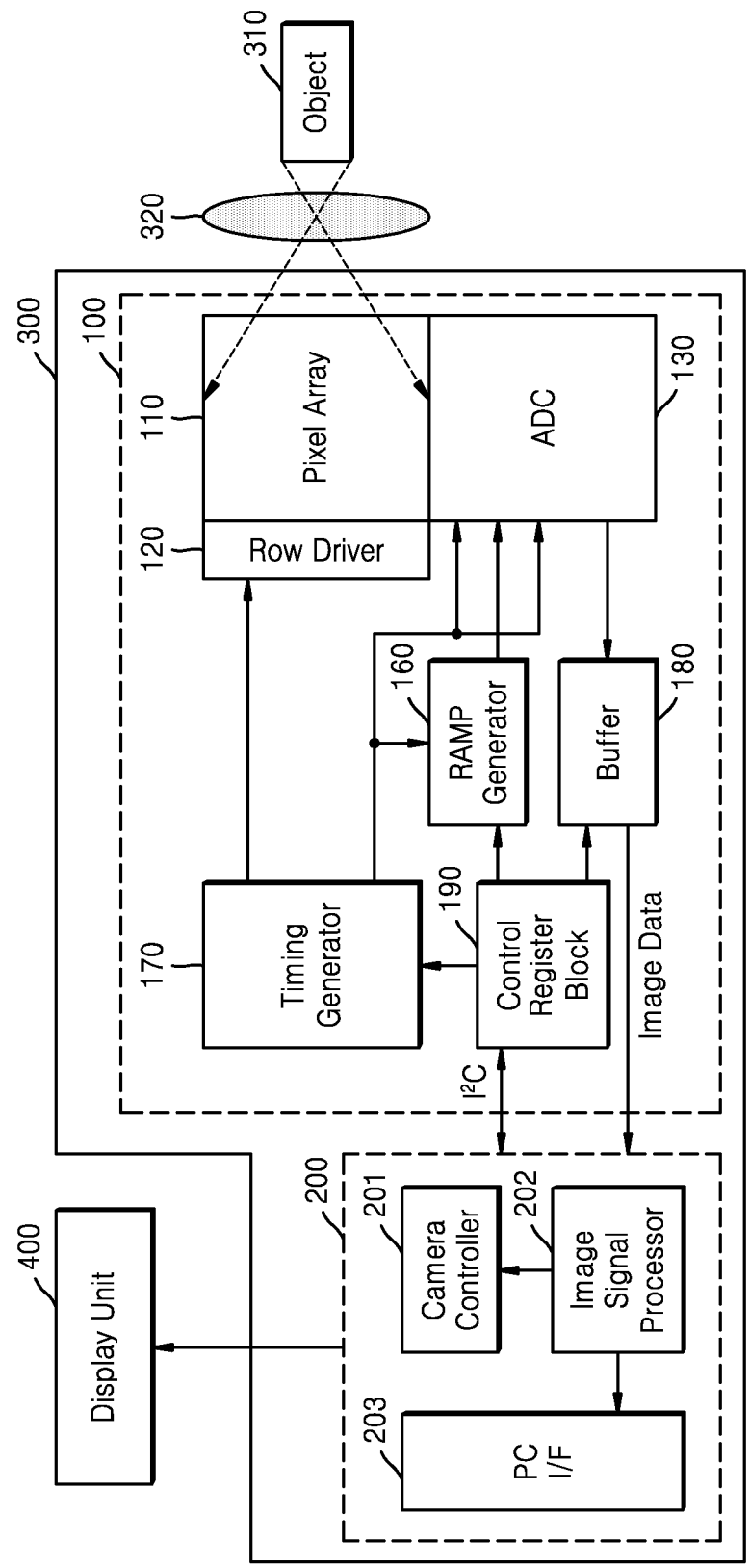
FIG. 20 is a block diagram illustrating an image processing system according to an exemplary embodiment of the inventive concept.

FIG. 20 is a block diagram illustrating an image processing system according to an exemplary embodiment of the inventive concept.

Referring to FIG. 20, in an exemplary embodiment, an image processing system 3000 includes an image sensor 100, an image processor 200, a display unit 400, and a lens 320.

The image sensor 100 may include a pixel array 110, a row driver 120, an ADC 130, a ramp generator 160, a timing generator 170, a control register block 190, and a buffer 180.

The image sensor 100 may sense, by control of the image processor 200, an object 310 imaged through the lens 320, and the image processor 200 may output an image to the display unit 300, the image being sensed and output by the image sensor 100. Here, the display unit 300 may include every device capable of outputting an image. For example, the display unit 300 may include, but is not limited to, computers, mobile phones, and other image outputting terminals.

The image processor 200 may include a camera controller 201, an image signal processor 202, and a PC interface (I/F) 203. The camera controller 201 may control the control register block 190. In an exemplary embodiment, the camera controller 201 may control the image sensor 100, that is, the control register block 190, by using an inter-integrated circuit (I2C). However, exemplary embodiments of the inventive concept are not limited thereto, and various interfaces may be applied between the camera controller 201 and the control register block 190.

The image signal processor 202 may receive image data, which is an output signal of the buffer 180, may process the image data so that an image is appropriately viewed by a human, and may output the processed image to the display unit 400. Alternatively, the image signal processor 202 may receive a control signal from a host external thereto via the PC I/F 203, and may provide the processed image to the external host. Although the image signal processor 202 is shown in FIG. 20 as being located inside the image processor 200, exemplary embodiments of the inventive concept are not limited thereto. For example, in exemplary embodiments, the image signal processor 202 may be located inside the image sensor 100.

The image sensor 100 described with reference to FIG. 1 may be implemented as the image sensor 100 in the display unit 300. The control register block 190 may output a control signal to each of the ramp generator 160, the timing generator 170, and the buffer 180, and thus, may control operations thereof. Here, the control register block 190 may be controlled by the camera controller 201 and thus be operated.

A correlated double sampling circuit included in the ADC 130 may include a first amplifier, which compares a pixel signal with a ramp signal, and a second amplifier that amplifies and outputs an output of the first amplifier. In an exemplary embodiment, the first amplifier may be operated, in an auto-zero phase, based on a smaller amount of a bias current than in a comparison operation phase. Thus, noise may be reduced, and an input range of the first amplifier may be increased. In an exemplary embodiment, the second amplifier may adaptively control current sources generating bias currents on an operation phase basis, and may generate a minimum bias current before and after a decision. Therefore, a power fluctuation may be prevented. In an exemplary embodiment, the first amplifier may include a limiting circuit connecting an output terminal to a common node. The limiting circuit may prevent a voltage level of the common node from being reduced below a minimum value allowing the first amplifier to be normally operated, and may compensate a voltage fluctuation occurring at an output node.

Since the pixel array 110, the row driver 120, the ADC 130, the ramp generator 160, the timing generator 170, and the buffer 180 have been described in detail with reference to FIG. 1, repeated descriptions thereof will be omitted.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An analog-to-digital conversion circuit, comprising:
   a first amplifier that generates a first output signal by comparing a pixel signal output from a pixel array with a ramp signal; and
   a second amplifier that generates a comparison signal based on the first output signal,
   wherein the first amplifier comprises:
   a first current source that generates a first bias current in a first operation period and a second operation period; and
   a second current source that generates a second bias current in the first operation period,
   wherein the analog-to-digital conversion circuit converts an analog signal output from the pixel array into a digital signal.

2. The analog-to-digital conversion circuit according to claim 1, wherein the first current source sinks the first bias current, and the second current source generates the second bias current.

3. The analog-to-digital conversion circuit according to claim 1, wherein an amount of the second bias current is less than an amount of the first bias current.

4. The analog-to-digital conversion circuit according to claim 1, wherein the first amplifier further comprises:
an input stage comprising a first input and a second input, wherein the first input receives the ramp signal and the second input receives the pixel signal; and
an output stage comprising a first output node and a second output node, wherein the output stage generates an output signal based on a voltage difference between the first input and the second input,
wherein a static current flowing through the input stage is less than the first bias current in the first operation period, and the static current flowing through the input stage is about equal to the first bias current in the second operation period.

5. The analog-to-digital conversion circuit according to claim 4, wherein, in the first operation period, the first input is connected to the second output node, and the second input is connected to the first output node.

6. The analog-to-digital conversion circuit according to claim 4, wherein the output stage further comprises:
a first transistor comprising a drain and a gate, wherein the drain of the first transistor is connected to the first output node and the gate of the first transistor is connected to the second output node; and
a second transistor comprising a drain and a gate, wherein the drain of the second transistor and the gate of the second transistor are connected to the second output node,
wherein the second current source comprises:
a bias transistor comprising a gate connected to the second output node; and
a switching transistor connected between the bias transistor and the first current source.

7. The analog-to-digital conversion circuit according to claim 1, wherein the first amplifier performs an operation of comparing the pixel signal with the ramp signal in the second operation period, and the second current source is turned off in the second operation period.

8. The analog-to-digital conversion circuit according to claim 1, wherein the first current source and the second current source are connected to a common node,
a first power supply voltage is applied to the first current source,
a second power supply voltage is applied to the second current source, and
a level of the second power supply voltage is higher than a level of the first power supply voltage.

9. The analog-to-digital conversion circuit according to claim 1, wherein the first current source and the second current source are connected to a common node,
a first power supply voltage is applied to the first current source,
a second power supply voltage is applied to the second current source, and
a level of the second power supply voltage is lower than a level of the first power supply voltage.

10. The analog-to-digital conversion circuit according to claim 1, wherein a third bias current of the second amplifier is set based on a difference between the first bias current and the second bias current.

11. An amplifier, comprising:
a first current source that generates a first bias current based on a first power supply voltage in a first operation period and a second operation period;
a second current source that generates a second bias current based on a second power supply voltage in the first operation period, wherein the second current source is turned off in the second operation period;
an input stage that receives a pixel signal and a ramp signal; and
an output stage that outputs a comparison signal generated based on a level difference between the pixel signal and the ramp signal.

12. The amplifier according to claim 11, wherein a level of the first power supply voltage is lower than a level of the second power supply voltage.

13. The amplifier according to claim 11, wherein an amount of the second bias current is less than an amount of the first bias current.

14. The amplifier according to claim 11, wherein the first current source sinks the first bias current, and the second current source generates the second bias current.

15. The amplifier according to claim 11, wherein the input stage is operated based on a third bias current corresponding to a difference between the first bias current and the second bias current in the first operation period, and the input stage is operated based on the first bias current in the second operation period.

16. An image sensor, comprising:
a pixel array comprising a plurality of pixels; and
a comparison circuit that compares a pixel signal output from the pixel array with a ramp signal,
wherein the comparison circuit operates in an auto-zero period based on a first bias current, and operates in a comparison operation period based on a second bias current that is different from the first bias current.

17. The image sensor according to claim 16, wherein the comparison circuit comprises:
a first amplifier that operates in the auto-zero period based on the first bias current; and that operates in the comparison operation period based on the second bias current; and
a second amplifier that operates in the auto-zero period and the comparison operation period based on a third bias current that is proportional to the first bias current.

18. The image sensor according to claim 17, wherein the first amplifier comprises:
a first current source that generates the second bias current in the auto-zero period and the comparison operation period; and
a second current source that generates a fourth bias current in the auto-zero period,
wherein a difference between the second bias current and the first bias current is about equal to the fourth bias current.

19. The image sensor according to claim 18, wherein the second current source is turned off in the comparison operation period.

20. The image sensor according to claim 16, further comprising:
a counter circuit that counts an output signal of the comparison circuit,
wherein the comparison circuit and the counter circuit perform a correlated double sampling operation.

* * * * *